US008896355B1

(12) United States Patent
Lu et al.

(10) Patent No.: US 8,896,355 B1
(45) Date of Patent: Nov. 25, 2014

(54) CLOCK MULTIPLIER WITH DYNAMICALLY TUNED LOCK RANGE

(71) Applicant: Rambus Inc., Sunnyvale, CA (US)

(72) Inventors: Yue Lu, Albany, CA (US); Jared L. Zerbe, Woodside, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/172,031

(22) Filed: Feb. 4, 2014

Related U.S. Application Data

(63) Continuation of application No. 13/535,690, filed on Jun. 28, 2012, now Pat. No. 8,643,409.

(60) Provisional application No. 61/567,052, filed on Dec. 5, 2011, provisional application No. 61/504,155, filed on Jul. 1, 2011.

(51) Int. Cl.
H03B 19/00 (2006.01)
H03L 7/08 (2006.01)

(52) U.S. Cl.
CPC .................. *H03L 7/0802* (2013.01)
USPC ........................................................ 327/119

(58) Field of Classification Search
USPC ........................................................ 327/119
See application file for complete search history.

(56) References Cited

U.S. PATENT DOCUMENTS

| 5,122,677 | A | 6/1992 | Sato |
| 5,142,247 | A | 8/1992 | Lada, Jr. et al. |
| 6,466,073 | B1 | 10/2002 | Yukinari et al. |
| 6,961,862 | B2 | 11/2005 | Best et al. |
| 7,636,002 | B2 * | 12/2009 | Kim .............................. 327/158 |
| 7,940,830 | B2 | 5/2011 | Marsili et al. |
| 7,948,812 | B2 | 5/2011 | Ware |
| 2005/0265437 | A1 | 12/2005 | Yeung et al. |
| 2009/0088113 | A1 | 4/2009 | Marsili et al. |
| 2009/0167441 | A1 | 7/2009 | Song et al. |
| 2009/0175116 | A1 | 7/2009 | Song et al. |

OTHER PUBLICATIONS

Paciorek, L.J., "Injection Locking of Oscillators," Nov. 1965, Proceedings of the IEEE, vol. 53, No. 11, pp. 1723-1728. 6 pages.
PCT International Preliminary Report on Patentability dated Jan. 16,2014 (Chapter I) in International Application No. PCT/US2012/039268. 12 pages.
PCT International Search Report and Written Opinion dated Dec. 20, 2012 in International Application No. PCT/US2012/039268. 15 pages.
Rategh et al., "Superharmonic Injection-Locked Frequency Dividers," IEEE Journal of Solid-State Circuits, vol. 34, No. 6, pp. 813-821, Jun. 1999. 9 pages.

(Continued)

*Primary Examiner* — Daniel Rojas
(74) *Attorney, Agent, or Firm* — Charles Shemwell

(57) ABSTRACT

A variable-frequency input clock signal and a reference clock signal are compared during a frequency-compare interval to generate a value that indicates a ratio of their frequencies. The frequency-ratio value is then applied to configure a wide-range frequency-locking oscillator for operation with a narrowed input frequency range. Because the narrowed input frequency range is targeted to the input clock frequency, the wide-range oscillator is able to rapidly lock to a frequency multiple of the input clock frequency. Because the frequency-compare interval is also brief, an extremely fast-locking, clock-multiplying operation may be effected over a relatively wide range of input clock frequencies.

20 Claims, 9 Drawing Sheets

(56) References Cited

OTHER PUBLICATIONS

Razavi, Behzad, "A Study of Injection Locking and Pulling in Oscillators," IEEE Journal of Solid-State Circuits, vol. 39, No. 9, Sep. 2004, pp. 1415-1424. 10 pages.
Shekhar et al., "Strong Injection Locking in Low-Q LC Oscillators: Modeling and Application in a Forwarded-Clock I/O receiver," IEEE Transactions on Circuits and Systems—I: Regular Papers, vol. 56, No. 8, Aug. 2009, pp. 1818-1829. 12 pages.
Vanassche et al., "On the Difference between Two Widely Publicized Methods for Analyzing Oscillator Phase Behavior," 2002, IEEE, pp. 229-233. 5 pages.
Zhang et al., "Injection-Locked Clocking: A New GHz Clock Distribution Scheme," IEEE 2006 Custom Integrated Circuits Conference (CICC), pp. 785-788. 4 pages.
Adler, Robert, "A Study of Locking Phenomena in Oscillators," Jun. 1946, Proceedings of the I.R.E. and Waves and Electrons, pp. 351-357. 7 pages.
Carusone, Tony Chan, "Injection-Locking for High-Speed Wireline Communication," University of Toronto, Apr. 15, 2010. 14 pages.
Casper et al., "A 20Gb/s Forwarded Clock Transceiver in 90nm CMOS," 4.6, ISSCC 2006, Session 4. 10 pages.
Farjad-Rad et al., "A 33-mW 8-Gb/s CMOS Clock Multiplier and CDR for Highly Integrated I/Os," IEEE Journal of Solid-State Circuits, vol. 39, No. 9, Sep. 2004, pp. 1553-1561. 9 pages.
Hossain et al., "5-10 Gb/s 70 mW Burst Mode AC Coupled Receiver in 90-nm CMOS,".
Hossain et al., "A 6.8mW 7.4Gb/s Clock-Forwarded Receiver with up to 300MHz Jitter Tracking in 65nm CMOS," ISSCC 2010, Session 8, High-Speed Wireline Transceivers 8.2, pp. 158-160. 3 pages.
Hossain et al., "CMOS Oscillators for Clock Distribution and Injection-Locked Deskew," IEEE Journal of Solid-State Circuits, vol. 44, No. 8, pp. 2138-2153, Aug. 2009. 16 pages.
Hu et al., "A 0.6mW/Gbps, 6.4-8.0Gbps Serial Link Receiver Using Local Injection-Locked Ring Oscillators in 90nm CMOS," 2009 Symposium on VLSI Circuits Digest of Technical Papers. 2 pages.
Hu et al., "A 0.6 mW/Gb/s, 6.4-7.2 Gb/s Serial Link Receiver Using Local Injection-Locked Ring Oscillators in 90 nm CMOS," IEEE Journal of Solid-State Circuits, vol. 45, No. 4, Apr. 2010, pp. 899-908. 10 pages.
Jaussi et al., "A 20Gb/s Embedded Clock Transceiver in 90nm CMOS," 18.8, ISSCC 2006 Session 18. 10 pages.
Kratyuk et al., "Frequency Detector for Fast Frequency Lock of Digital PLLs," Electronic Letters, vol. 43, No. 1, pp. 13-14, Jan. 4, 2007. 2 pages.
Lai et al., "Capturing Oscillator Injection Locking via Nonlinear Phase-Domain Macromodels," IEEE Transactions on Microwave Theory and Techniques, vol. 52, No. 9, Sep. 2004, pp. 2251-2261. 11 pages.
Lee et al., "Paper 5.2: Subharmonically Injection-Locked PLLs for Ultra-Low-Noise Clock Generation," Slides, 2009 IEEE International Solid-State Circuits Conference. 32 pages.
Lee et al., "Subharmonically Injection-Locked PLLs for Ultra-Low-Noise Clock Generation," ISSCC 2009, Session 5, 5.2, pp. 91-93. 3 pages.
Maffezzoni, Paolo, "Analysis of Oscillator Injection Locking Through Phase-Domain Impulse-Response," IEEE Transactions on Circuits and Systems—I: Regular Papers, vol. 55, No. 5, Jun. 2008, pp. 1297-1305. 9 pages.
Mahony et al., "A 27Gb/s Forwarded-Clock I/O Receiver Using an Injection-Locked LC-DCO in 45nm CMOS," 25.1, ISSCC 2008 Session 25, pp. 452-453, 627. 3 pages.
Mirzaei et al., "Multi-Phase Injection Widens Lock Range of Ring-Oscillator-Based Frequency Dividers," IEEE Journal of Solid-State Circuits, vol. 43, No. 3, Mar. 2008, pp. 656-671. 16 pages.
Ng et al., "A Second-Order Semidigital Clock Recovery Circuit Based on Injection Locking," IEEE Journal of Solid-State Circuits, vol. 38 No. 12, Dec. 2003, pp. 2101-2110, plus corresponding ISSCC 2003 Session 4 paper 4.3. 18 pages.
O'Mahony et al., "Paper 25.1: A 27Gb/s Forwarded-Clock I/O Receiver using an Injection-Locked LC-DCO in 45nm CMOS," IEEE International Solid-State Circuits 2008. 39 pages.
O'Mahony et al., "A Programmable Phase Rotator based on Time-Modulated Injection-Locking," 2010 IEEE Symposium on VLSI Circuits (VLSIC), Honolulu, HI, Jun. 16-18, 2010, pp. 45-46. 2 pages.

\* cited by examiner

Frequency Scaling

Burst Operation

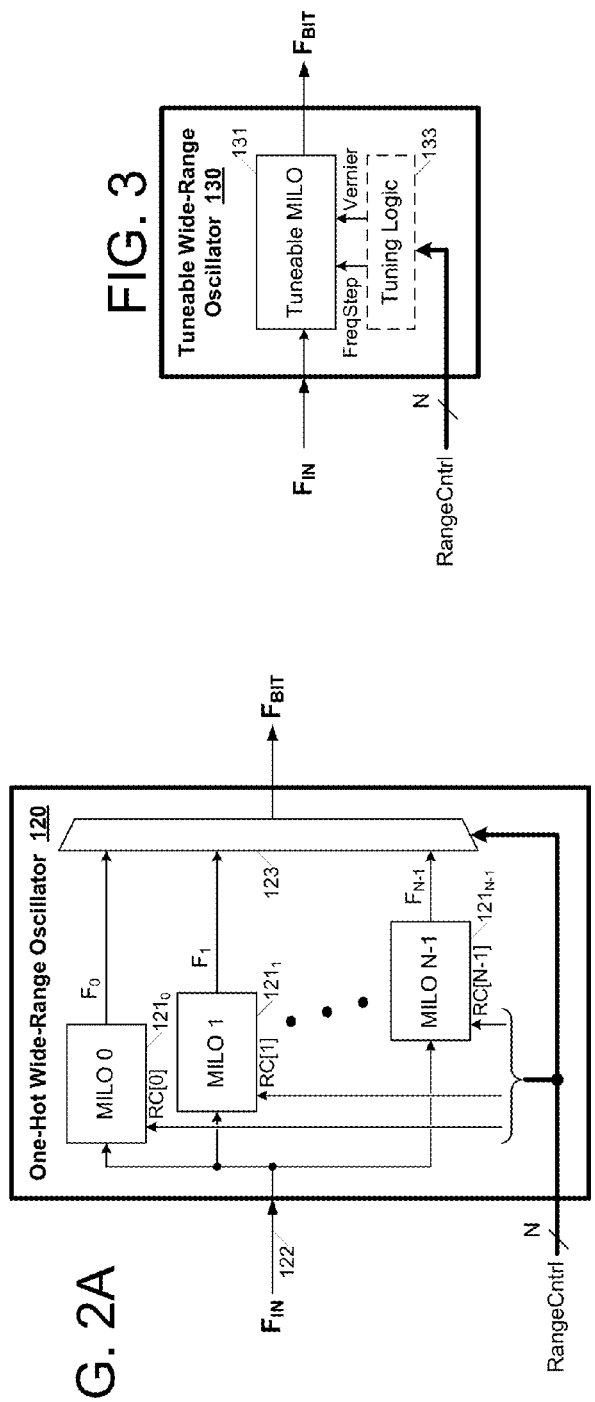
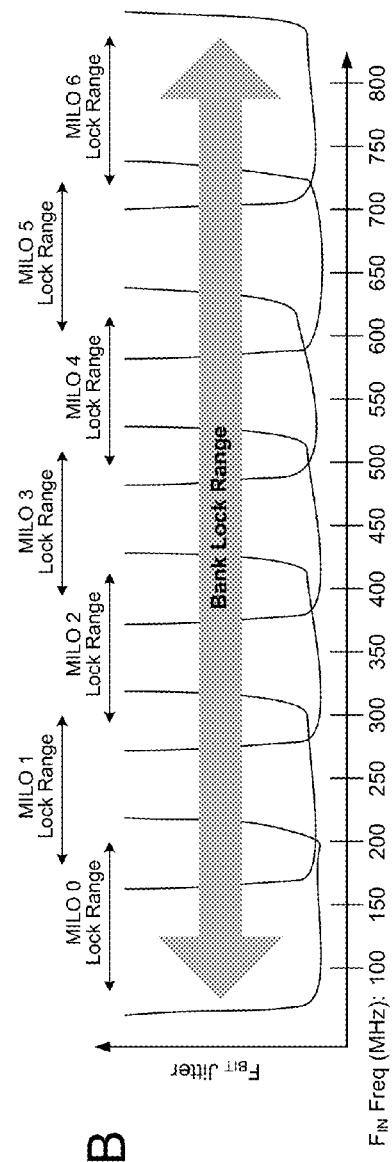
FIG. 2A
FIG. 2B
FIG. 3

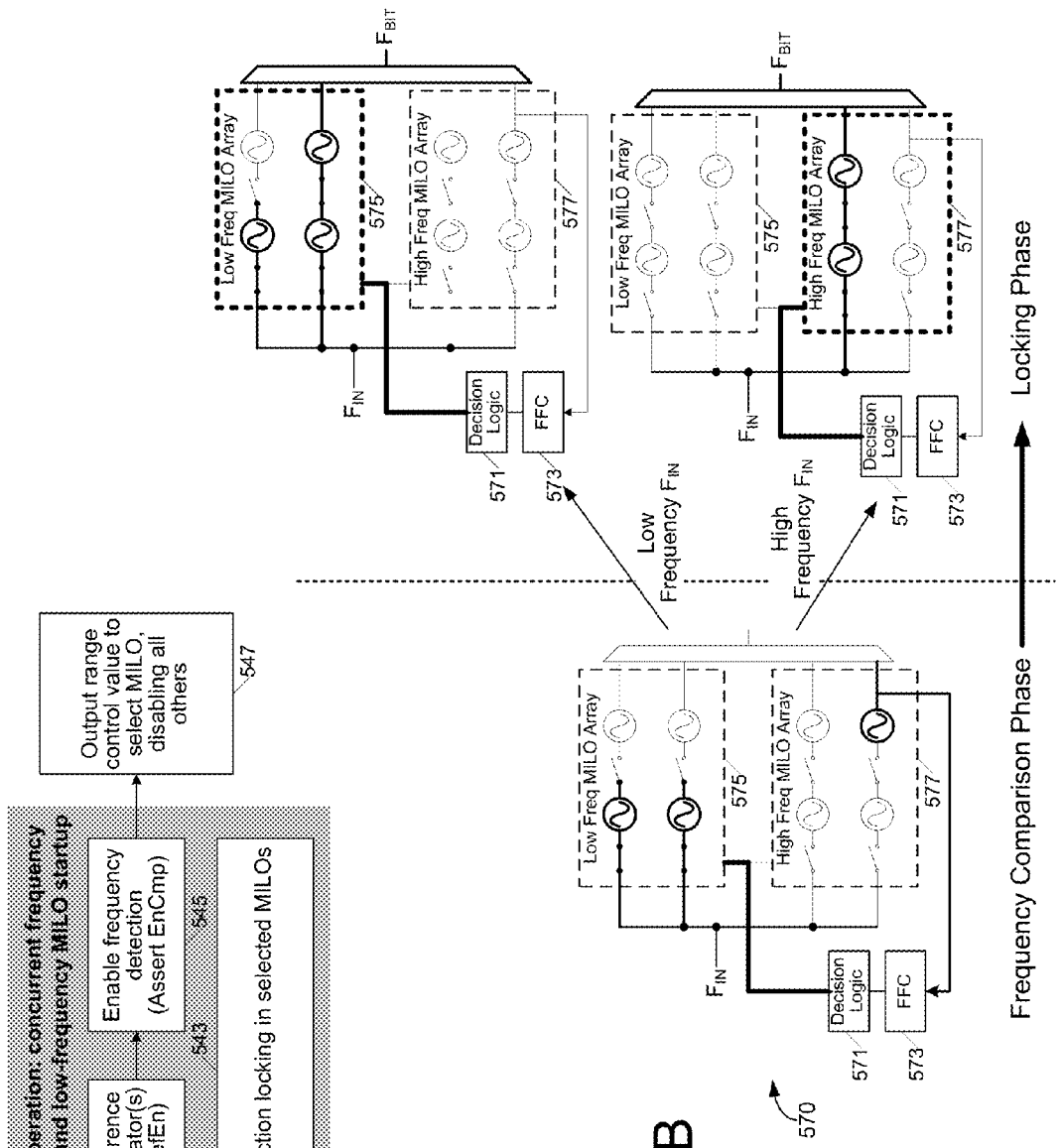
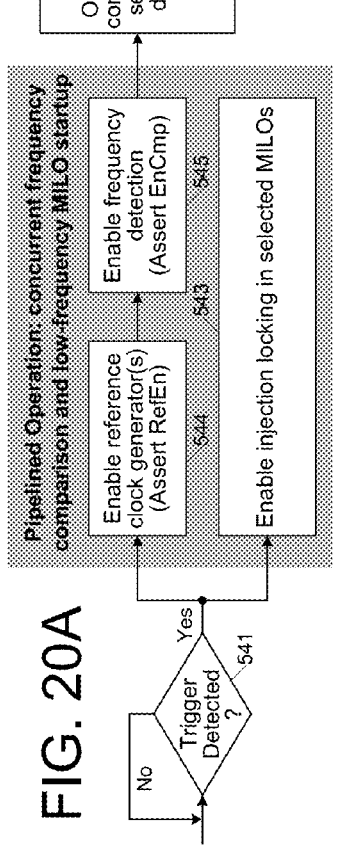
FIG. 20A
FIG. 20B

CLOCK MULTIPLIER WITH DYNAMICALLY TUNED LOCK RANGE

CROSS REFERENCE TO RELATED APPLICATIONS

This application is a continuation of U.S. patent application Ser. No. 13/535,690 filed Jun. 28, 2012 and entitled "Wide-Range Clock Multiplier," which claims priority to the following U.S. Provisional Patent Applications:

| Application No. | Filing Date | Title |
| --- | --- | --- |
| 61/504,155 | Jul. 1, 2011 | Low-Latency, Frequency-Agile Clock Multiplier |
| 61/567,052 | Dec. 5, 2011 | Wide-Range Clock Multiplier |

Each of the above-identified patent applications is hereby incorporated by reference.

TECHNICAL FIELD

The present invention relates generally to the field of integrated circuits, and more particularly to clock generation in integrated circuits and systems of integrated circuit devices.

BACKGROUND

Frequency-agile clocking has emerged as an effective power-conservation technique in mobile devices. Ideally, the system clock that serves as a primary timing reference for functional operations is switched instantly between various frequencies, scaling power consumption according to the work at hand. In practice, latency (delay) between frequency shifts can be incurred at each frequency transition as frequency-multiplier circuitry stabilizes the system clock at its new frequency following each change.

Unfortunately, conventional phase-locked loop (PLL) multipliers require relatively long re-lock times following frequency changes and thus, despite a potentially broad input frequency range, incur latency penalties which should be avoided in a frequency-agile system if the system is to attempt to use the lowest frequency possible as a method of power conservation. Conversely, injection-locked oscillators exhibit fast lock times, but tend to have a narrow input frequency range and thus limited frequency agility.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A illustrates an embodiment of a wide-range oscillator that may be used to implement wide-range oscillator of FIG. 1A;

FIG. 2B illustrates exemplary spectrally-staggered lock ranges of respective component oscillators within the wide-range oscillator of FIG. 2A, for the case where n=6;

FIG. 3 illustrates an embodiment of a tuneable wide-range oscillator that may be used to implement a wide-range oscillator within clock multiplying unit of FIG. 1A;

FIG. 20A illustrates an alternative frequency-locking approach in which frequency compare operations and injection locking operations of at least one MILO loop are carried out concurrently, in effect pipelining the two operations so that the time required for one operation may be completely or partially hidden under the other; and FIG. 20B illustrates an embodiment of a clock multiplier unit that applies the pipelined injection-locking and frequency compare approach of FIG. 20A, but limits the pipelining to the lower frequency oscillators that exhibit the slowest injection-locking times.

DETAILED DESCRIPTION

Low-latency, frequency-agile clock multipliers and systems containing same are disclosed in various embodiments herein. In one embodiment, a variable-frequency input clock signal and a self-generated reference clock signal are compared during a frequency-compare interval to generate a value that indicates a ratio of their frequencies. The frequency-ratio value is then applied to configure a wide-range frequency-locking oscillator for operation with a targeted input frequency range. In one embodiment, for example, one of multiple spectrally staggered component oscillators within the wide-range oscillator is selected based on the frequency-ratio value and thereafter enabled to oscillate at a frequency multiple of the input clock. In another embodiment, the frequency-locking range of the wide-range oscillator is tuned to a relatively narrow target range indicated by the frequency-ratio value and the oscillator thereafter enabled to oscillate at the frequency multiple of the input clock. In either case, because the lock frequency range of a selected or tuned oscillator is relatively narrow and targeted to multiply the input clock frequency, the selected or tuned oscillator is enabled to rapidly lock to a frequency multiple of the input clock frequency. Because the frequency-compare interval is also brief and completed, for example, over a single cycle of a low-frequency input clock signal or only a few cycles of a higher-frequency input clock signal, an extremely fast-locking clock-multiplying operation may be effected over a relatively wide range of input clock frequencies.

Figure 1A:
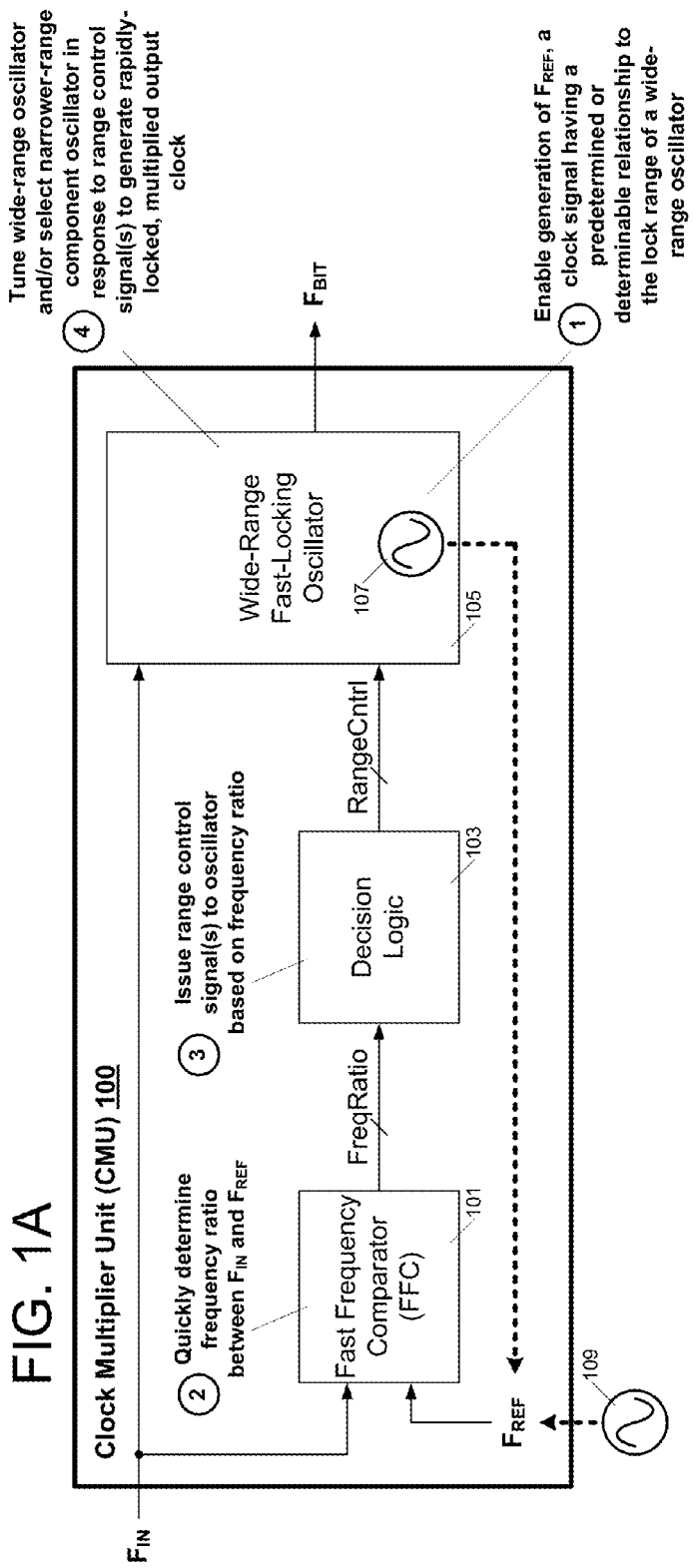
FIG. 1A illustrates an embodiment of a frequency-agile, fast-locking clock multiplier unit (CMU) that generates a frequency-multiplied output clock in response to a variable-frequency reference clock.
Figure 1B:
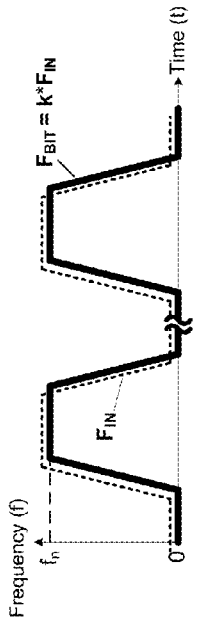
FIG. 1B illustrates an exemplary frequency-scaling operation performed within the CMU of FIG. 1A.
Figure 1C:
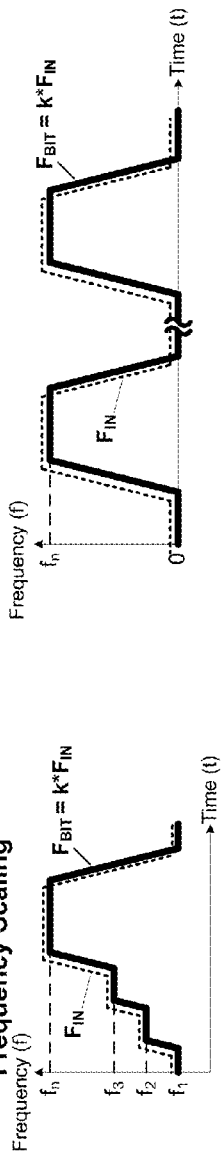
FIG. 1C illustrates an exemplary burst-mode of operation within the CMU of FIG. 1A.

FIG. 1A illustrates an embodiment of a frequency-agile, fast-locking clock multiplier unit 100 (CMU) that generates a frequency-multiplied output clock signal, $F_{BIT}$, in response to a variable-frequency input clock signal, $F_{IN}$. More specifically, as shown in FIGS. 1B and 1C, CMU 100 responds to transitions in the input clock frequency by effecting corresponding transitions in the output clock frequency so that the output clock frequency is maintained at a frequency multiple ('k') of the input clock frequency (i.e., $F_{BIT}=k*F_{IN}$). Thus, CMU 100 supports the frequency scaling operation shown in FIG. 1B, quickly locking the output clock at a frequency multiple of the input clock as the input clock transitions between various frequencies ranging from $f_1$ to $f_n$, as well as the burst operation shown in FIG. 1C, in which the input clock transitions between off and on states (i.e., from a paused state, frequency=0, to a maximum frequency, $f_n$) to support burst processing requirements within a host system; note that during burst processing, the output clock is correspondingly transitioned between zero-frequency and frequency-multiplied states.

Referring to the exemplary operations enumerated 1-4 in FIG. 1A, CMU 100 initially responds to an input frequency step (which may be detected or signaled by other circuitry within the host system) by enabling generation of a reference clock signal, $F_{REF}$, having a predetermined (or determinable) relationship to the lock range of the components of a wide-range oscillator 105. In one embodiment, for example, the reference clock is generated by enabling free-running operation of a component oscillator 107 within wide-range oscillator 105 and thus represents a maximum, minimum, or other sub-range frequency within the broader frequency range spanned by wide-range oscillator 105. In another embodiment, the reference clock signal is generated by a clock source 109 disposed externally to the CMU (which may include a source external to the host integrated circuit (IC) in which the CMU is implemented). External clock source 109 may oscillate at a frequency having a predetermined or fixed relationship to the frequency range of the wide-range oscillator or, alternatively, may be compared with a clock output by the wide-range oscillator to ascertain the relationship between the reference clock and the lock-range of the wide-range oscillator. In either case, the reference clock and input clock are compared within a fast frequency comparator to generate a frequency-ratio value, "FreqRatio," that indicates the relative frequencies of the two clock signals.

In one embodiment, fast frequency comparator 101 outputs the frequency-ratio value to decision logic 103 which, in response, generates or obtains a corresponding range-control value ("RangeCntrl") and outputs the range-control value to wide-range oscillator 105. In an alternative embodiment, the frequency-ratio value may itself be supplied as the range-control value to the wide-range oscillator, thus avoiding the need for conversion or lookup-circuitry within decision logic 103. In either case, wide-range oscillator 105 applies the range-control value either to tune internal circuitry for operation within a narrower lock range indicated by the range-control value or to select one of multiple spectrally-staggered component oscillators corresponding to the narrower lock range. In either case this is done by enabling fast (low-latency) locking of output clock signal ($F_{BIT}$) to a frequency multiple of the input clock signal.

FIG. 2A illustrates an embodiment of a "one-hot" wide-range oscillator 120 that may be used to implement wide-range oscillator 105 of FIG. 1A. In the particular implementation shown, a set of component oscillators, in this case multiplying injection-locked oscillators (MILOs) $121_0$-$121_{N-1}$, are coupled in parallel to an input clock line 122 and thus all receive input clock signal, $F_{IN}$. The MILOs (collectively, 121) are designed or operated with spectrally offset naturally frequencies and thus have correspondingly staggered frequency-lock ranges (i.e., frequency-shifted lock ranges that overlap one another) as shown, for example, in FIG. 2B. In some embodiments the same design is used for each MILO but different settings are applied which alter its natural operating frequency point. By pre-characterizing the spectrally-staggered lock ranges with respect to the frequency of a reference clock (e.g., $F_{REF}$ shown in FIG. 1A) so that, for example, upper/lower frequency bounds of each MILO lock range (or center frequencies of the MILO lock ranges or natural frequencies of the MILOs) are represented as ratios of the reference clock frequency, a subsequently determined ratio of the input clock and reference clock frequencies may be used to identify one of the MILOs as having a superlative lock range with respect to the input clock frequency. In one embodiment, for instance, the MILO having a lock range most centered with respect to the input/reference clock ratio is identified. In another embodiment, the MILO having the lowest jitter measure at the frequency indicated by the input/reference clock ratio is identified. In other embodiments, alternative criteria (or any combination of multiple criterion) are algorithmically and/or heuristically applied to identify the MILO deemed to have the superlative lock range for a given input clock frequency.

However ascertained, the output of the identified MILO is enabled by one or more bits of the N-bit range-control value (RC[N−1:0]) to injection lock to a frequency multiple of the input clock signal and thus generate a MILO output clock, $F_i$, where 'i' is the index of the enabled MILO and ranges from 0 to N−1. A multiplexer 123 or other selector circuit is provided to enable the MILO output clock to be output from the wide-range oscillator 120 and thus from the host clock multiplying unit as output clock signal, $F_{BIT}$.

Still referring to FIG. 2A, while the identified MILO is enabled to generate the CMU output clock, $F_{BIT}$, the remaining MILOs 121 may be disabled to save power. Wide-range oscillator 120 is accordingly referred to herein as a "one-hot" oscillator as only one of multiple constituent MILOs (i.e., component oscillators) is enabled to source the CMU output clock, while all others are disabled. Reflecting on the circuit components shown, it should be noted that multiplexer 123 may be omitted in a wired OR configuration in which all MILOs 121 other than the identified MILO are disabled (i.e., selector circuit effected by disabling of non-selected MILOs rather than through explicit multiplexing circuitry). Also, while multiplying injection locked oscillators form the component (constituent) oscillators within the wide range oscillator shown and other oscillator embodiments described below, alternative frequency-locking oscillator designs may be used in all cases. In some embodiments injection locked oscillators (ILOs) may be used or a combined MILO-ILO structure may be used instead. Similarly, while lock ranges of a specific number of MILOs (or other component oscillators) are depicted in the exemplary "bank" lock range of FIG. 2B, more or fewer lock ranges may be overlapped to span the input frequency range of interest and thus more or fewer component oscillators may be provided within a one-hot wide-range oscillator in alternative embodiments.

FIG. 3 illustrates an embodiment of a tuneable wide-range oscillator 130 that may be used to implement the wide-range fast-locking oscillator within clock multiplying unit 100 of FIG. 1A. As shown a tuneable MILO 131 is provided to generate the CMU output clock, FBIT, in response to input clock $F_{IN}$. More specifically, instead of selecting between multiple MILOs having spectrally staggered lock ranges as in the one-hot wide-range oscillator of FIG. 2A, the lock range of tuneable MILO 131 is configured (or adjusted or tuned) in accordance with an incoming range-control value to shift the relatively narrow lock range of tuneable MILO 131 to a frequency band that spans the input clock frequency. In one embodiment, for example, tuneable MILO 131 is configured to oscillate at its maximum natural frequency to establish the reference clock supplied to a fast frequency comparator (e.g., element 101 of FIG. 1A), with natural frequencies of other configurations of the tuneable MILO 131 being correlated (or calibrated) to its maximum natural frequency. By this arrangement, in some embodiments, upon determining the frequency ratio between input clock, $F_{IN}$, and the maximum natural frequency of tuneable MILO 130, a MILO configuration setting corresponding to a natural frequency deemed to best accommodate the input clock frequency (e.g., spectrally nearest the input clock frequency or yielding lowest jitter when tuneable MILO 131 is injection-locked to the input clock frequency) may be selected and applied to tuneable MILO 131. By this operation the lock range of wide-range oscillator 130 is effectively narrowed to the particular band of interest (i.e., a band centered about and/or otherwise well suited to the input clock frequency), thus enabling rapidly locked, multiplied clock generation. In these embodiments, a simplification of using a single tunable oscillator and not having to power down unused oscillators is obtained, at the expense of a critical path involving the effect of using RangeCntrl to adjust oscillator tuning.

Depending on the overall input frequency range to be spanned by tuneable wide-range oscillator 130, different types of frequency adjustment operations may be performed therein. In the embodiment shown, for example, an incoming range-control value is supplied to an optional tuning logic circuit 133 which in turn outputs coarse and fine lock-range adjustment signals, depicted as frequency step signals (FreqStep) and vernier signals (Vernier), respectively. In alternative embodiments, the range-control value may itself include such coarse and fine control signal fields (e.g., decision logic may generate the range-control value in a format that includes the coarse and fine control signal fields such that tuning logic 133 may be viewed as part of the decision logic shown in FIG. 1). In addition, where the overall range of the wide-range oscillator is more limited, such field distinctions might be unnecessary and tuning logic 133 in this case may be omitted.

Figure 4:
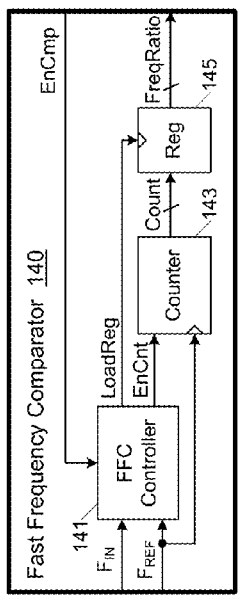
FIG. 4 illustrates an embodiment of a fast frequency comparator that may be used to implement the fast frequency comparator of FIG. 1A.

FIG. 4 illustrates an embodiment of a fast frequency comparator 140 that may be used to implement fast frequency comparator 101 of FIG. 1A. As shown, the fast frequency comparator (referred to herein as a frequency comparator or FFC for brevity) includes an FFC controller 141, counter 143 and output register 145. The FFC controller 141 receives an input clock signal ($F_{IN}$) and reference clock signals ($F_{REF}$) from respective clock sources as discussed above and also receives a compare-enable signal (EnCmp) from the decision logic (i.e., element 103 of FIG. 1A) or other control circuitry. When the compare-enable signal is asserted, FFC controller 141 enables counter 143 to count edges (transitions) of the reference clock signal over one or more cycles of the input clock signal, thus generating an edge-count value that represents a ratio of the frequencies of the two clock signals. In alternate embodiments the input clock signal transitions can be counted over one or more cycle of the reference clock signal (i.e. their respective roles can be reversed) in the case where the reference clock frequency is lower than the input clock frequency.

Figure 5:
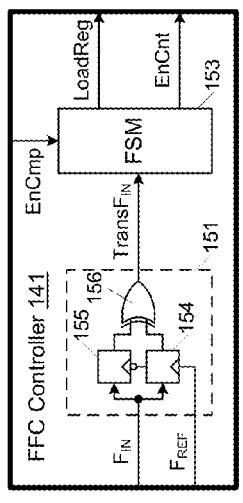
FIG. 5 illustrates an embodiment of a control logic circuit that may be used to implement the control logic shown FIG. 4.
Figure 6:
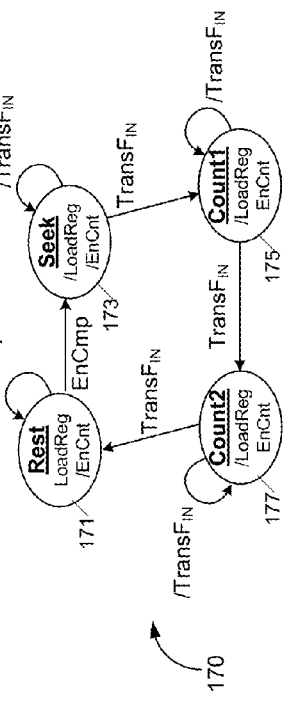
FIG. 6 illustrates an exemplary state diagram corresponding to the control logic circuit of FIG. 5.

In one embodiment, shown for example in FIGS. 5 and 6, FFC controller 141 includes a transition-detect circuit 151 to detect a rising or falling edge of input clock signal, $F_{IN}$. The FFC controller 141 also includes a finite state machine 153 that steps between rest, seek and edge-counting states in response to an input-transition signal, $TransF_{IN}$, from transition-detect circuit 151 and the compare-enable signal. More specifically, in the embodiment of FIG. 6, state machine 153 remains initially in rest state 171 until the compare-enable signal is asserted, and then transitions to seek state 173. Upon entering seek state 173, state machine 153 lowers a register-load signal (LoadReg) in preparation for an eventual capture of the edge-count value within output register 145 of FIG. 4. During the seek state, state machine 153 continues to hold a count-enable signal ("EnCnt") low until an input clock edge, and thus the start of a new input clock cycle, is detected. In the embodiment of FIG. 4, the count-enable signal is supplied to counter 143 and, while low, maintains the contents of the counter at (or resets the counter to) zero or another initial value. At the first edge of the reference clock following a transition of the input clock, the new state of the input clock is captured within one of flip-flops 154 or 155 of transition-detect circuit 151, producing a logic high output from state comparator 156 (shown, for example, as an exclusive OR gate) and thus an assertion of the input-transition signal, $TransF_{IN}$. As shown in FIG. 6, state machine 153 transitions from the seek state to a count1 state 175 in response to assertion of the input-transition signal, raising the count-enable signal to enable reference-clock edges to be counted (i.e., within counter 143 of FIG. 4). The input-transition signal is deasserted at the next edge of the reference clock (as the states of flip-flops 155 and 154 equalize) and is then asserted again following detection of the input clock edge that marks a half input clock cycle. As shown, state machine 153 transitions from count1 state 175 to a count2 state 177 following re-assertion of the input-transition signal, maintaining assertion of the count-enable signal to enable reference clock edges to be counted (i.e., within counter 143 of FIG. 4) over the second half cycle of the input clock signal. As before, the input-transition signal is deasserted at the second reference clock edge following the input clock transition and then asserted again following detection of the input clock transition that marks a complete cycle of the input clock signal.

In the embodiment of FIG. 6, reference clock edges are counted over a single cycle of the input clock in order to generate an edge-count that will be latched or registered as a frequency-ratio value. Accordingly, upon detecting the input clock transition while in count2 state 177, state machine 153 returns to rest state 171, asserting the register-load signal to trigger a register load operation within the output register of the fast-frequency comparator (i.e., output register 145 of FIG. 4) and deasserting the count-enable signal to reset the counter in preparation for a subsequent frequency comparison operation. Delay may be imposed between assertion of the register-load signal and deassertion of the count-enable signal to avoid a race between registering and clearing the edge-count value.

Figure 7:
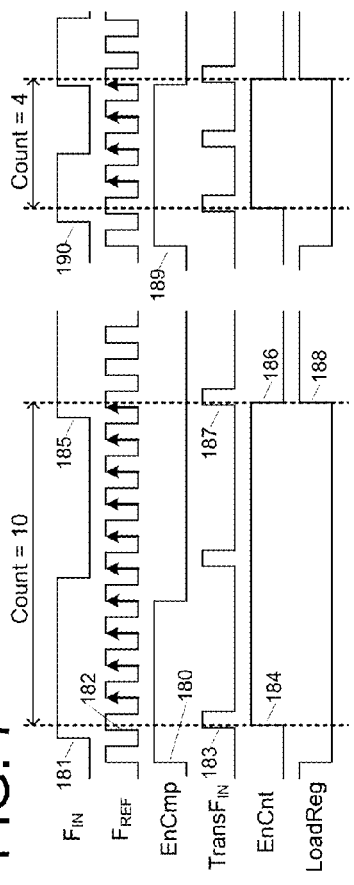
FIG. 7 is a timing diagram illustrating exemplary frequency comparison operations executed by the fast frequency comparator of FIG. 4.

FIG. 7 is a timing diagram illustrating exemplary frequency comparison operations executed by fast frequency comparator 140 of FIG. 4 (including components according to embodiments shown in FIGS. 5 and 6). Following initial assertion of the compare-enable signal (EnCmp) at 180, the FFC controller transitions to the seek state described above. The rising edge of the input clock signal at 181 is detected at edge 182 of the reference clock signal, a transition detection signaled by assertion of the input-transition signal for half a reference clock cycle at 183. Assertion of the input-transition signal enables reference clock edges to be counted within the fast frequency comparator during a frequency compare interval that spans the count1 and count2 states of the FFC controller. Thus, the count-enable signal is raised at 184 in response to the input-transition signal assertion and continues to be asserted after the falling edge of the input clock is detected (marking a transition of the FFC controller from the count1 to the count2 state) and then is deasserted at 186 in response to detection of the next rising edge 185 of the input clock. In the example shown, ten cycles of the reference clock transpire during the frequency compare interval (i.e., the interval over which the count-enable signal is asserted in the embodiment shown). Accordingly, in an implementation that counts rising but not falling edges of the reference clock, a count of 10 is accumulated within the counter and, upon assertion of the register-load signal (i.e., at 188, in response to the input-transition signal assertion at 187), is latched within the output register and thus output from the fast-frequency comparator as the frequency-ratio value, FreqRatio.

In the embodiment shown, the compare-enable signal is asserted for a time sufficient to ensure transition of the FFC controller from the seek state to the count1 state (i.e., at least as many reference clock cycles that are to transpire when the frequency ratio between the reference and input clocks is at a maximum permitted value) and is then deasserted. Accordingly, the compare-enable signal may be reasserted by the decision logic of the clock multiplier unit (or other control logic) at a later time (e.g., upon determining or being informed that the input clock frequency has changed). An example of this operation is shown by the compare-enable signal assertion at 189, an operation that triggers the above-described input transition detection and reference-clock counting operations after the input clock signal has transitioned to the relatively high frequency shown at 190. Because of the increased input clock frequency, fewer reference clock edges are counted over the frequency-compare interval (four reference clock edges in this example), thus yielding a correspondingly reduced frequency-ratio value as inspected in view of the reduced frequency ratio between the reference clock signal and input clock signal.

Reflecting on the operation of the fast frequency comparator operation described in reference to FIGS. 4-7, it can be seen that the step resolution of the frequency-ratio value decreases as the input clock frequency rises. That is, the change in the frequency-ratio value grows progressively smaller as the input clock frequency is increased in uniform steps from a minimum to a maximum frequency, at some point exceeding the ability of the fast-frequency comparator to resolve between frequency steps. A number of embodiments that enable higher-resolution frequency comparison are discussed below.

Figure 8:
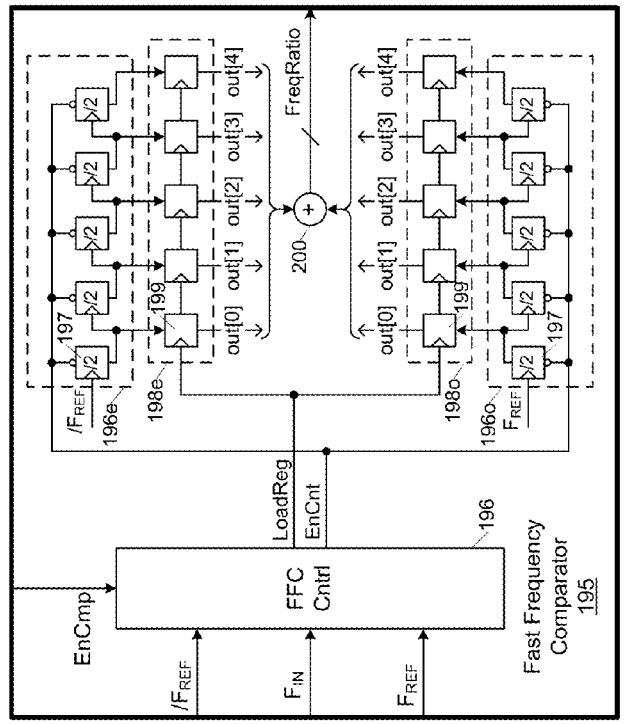
FIG. 8 illustrates an embodiment of a fast frequency comparator having counter circuitry to count both rising and falling edges of a reference clock signal and thus increase the resolution of a frequency-ratio value generated over a given frequency compare interval.

FIG. 8 illustrates an embodiment of a fast frequency comparator 195 having counter circuitry to count both rising and falling edges of a reference clock signal and thus increase the resolution of a frequency-ratio value generated over a given frequency compare interval. In the embodiment shown, the counter circuitry includes a rising edge counter 196$e$ (i.e., even-edge counter) coupled to receive the reference clock signal and falling-edge counter 196$o$ (i.e., odd-edge counter) coupled to receive a complement instance of the reference clock signal (i.e., an inverted instance of the reference clock signal in the case of a single-ended reference clock, or the complement leg of a differential reference clock). Each of the counters 196$e$/196$o$ includes a daisy-chained sequence of five toggle-flops 197 (i.e., flip-flops configured to change state in response to each rising edge of an input signal) with the first toggle-flop in each chain being coupled to receive the reference clock (or inverted instance thereof). Each toggle-flop in the chain effects a divide-by-two frequency division so that the output of the initial toggle-flop is a clock signal having frequency F/2 (where 'F' is the reference clock frequency), the output of the second toggle-flop in the chain has frequency F/4, the output of the third toggle flop in the chain has frequency F/8 and so forth. Assuming that the toggle-flop states are all initially cleared to a low state in response to the deasserted count-enable signal (EnCnt), then the first reference clock edge applied to counters 196$e$/196$o$ following assertion of the count-enable signal will cause all five toggle-flop outputs from each counter to go high and thereafter toggle at the respective clock rates applied at their inputs. Accordingly, each toggle-flop 197 within a given one of counters 196$e$/196$o$ outputs a respective bit in a five-bit binary encoded value, with the overall value counting down from 31 to 0 and then underflowing to 31 in response to 32 edges of the input clock. In the embodiment shown, the output of counter circuits 196$e$/196$o$ are captured in respective 5-bit register circuits 198$e$/198$o$ (each formed by a collection of flip-flops or latches 199) in response to assertion of the register-load signal (LoadReg) with the outputs of register circuits 198$e$ and 198$o$ being added or otherwise combined within a summing circuit 200 to produce the final frequency-ratio value. In alternative embodiments, different types of counters and register circuits may be employed, including counters and register circuits having higher or lower bit resolution (e.g., 6-bit counter and register instead of the 5-bit circuits shown), counting up instead of down, and so forth. Also, the position of summing circuit and output register circuitry may be transposed so that the summing operation occurs prior to storage within the output register, thus halving the number of storage register elements required (i.e., a single set of output register elements 199 may be provided instead of the two shown). In yet other embodiments, the output register circuitry may be omitted altogether as the state of the frequency-ratio value remains static within the counters 196e/196o (and thus static at the output of summing circuit 200) until the next edge counting operation is enabled.

Figure 9:
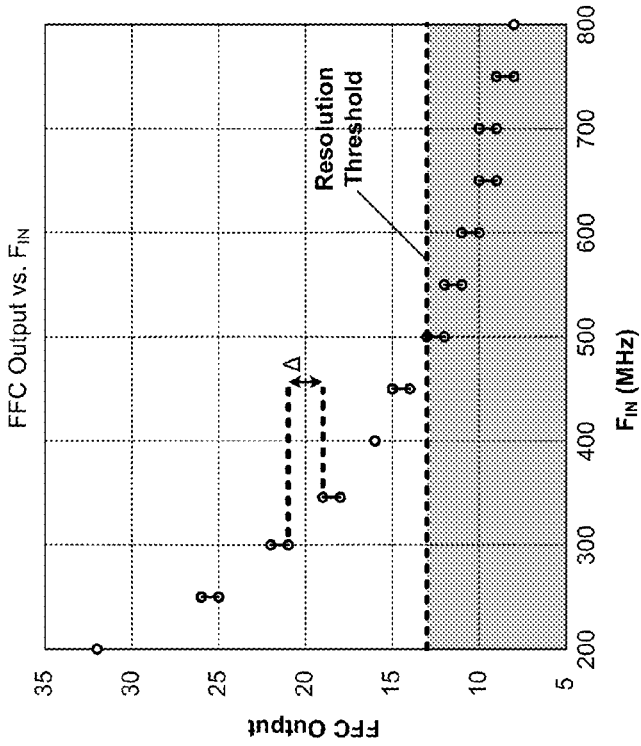
FIG. 9 illustrates an exemplary plot of frequency-ratio values generated within the fast frequency comparator of FIG. 8.

FIG. 9 illustrates an exemplary plot of frequency-ratio values generated within the fast frequency comparator of FIG. 8 assuming, for purposes of example only, that the reference clock signal oscillates at approximately 3.2 GHz (Gigahertz) and that the frequency-ratio value is inverted at some point prior to output from the frequency comparator (i.e., counting up edges of the reference clock instead of down). As shown, the fast frequency comparator yields distinguishable frequency-ratio values as the input clock frequency is increased in 50 MHz steps from 200 MHz to 450 MHz, but the distinctions blur above a frequency of approximately 450 MHz (i.e., when the count value drops below a resolution threshold marked by the shaded zone). To elaborate on this point, note that at relatively low frequencies of $F_{IN}$, the FFC outputs do not overlap (as demonstrated by a delta arrow between a pair of dashed lines), permitting ready output discrimination; as the input frequency increases, however, the FFC outputs can overlap, effectively defining the resolution threshold. Thus, while a frequency-ratio value of 25 or 26 may be clearly distinguished as a frequency ratio corresponding to a 250 MHz input clock, a frequency-ratio value of 10 may result from either a 600 MHz, 650 MHz or 700 MHz input clock.

Figure 10:
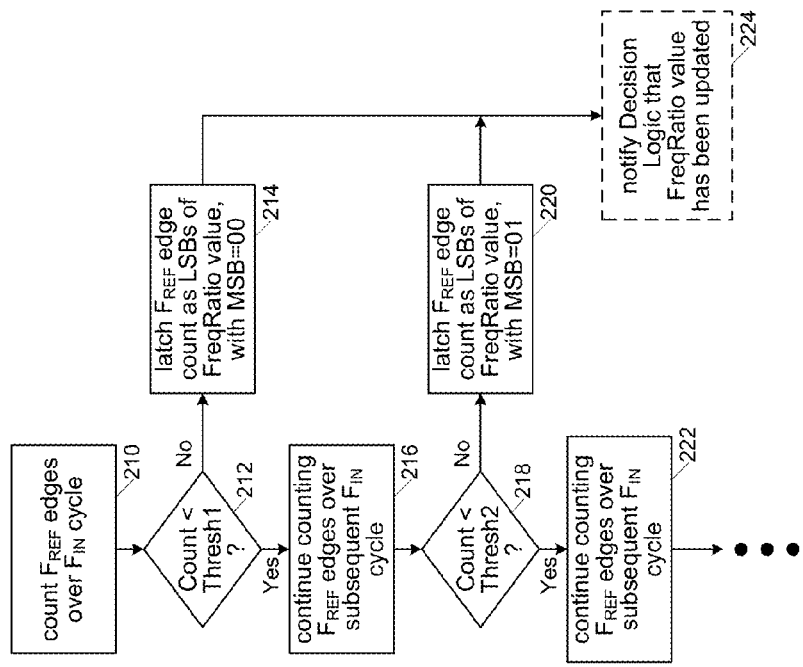
FIG. 10 illustrates one embodiment for increasing the edge-count resolution as the input clock approaches the resolution threshold shown in FIG. 9.

FIG. 10 illustrates one embodiment for increasing the edge-count resolution as the input clock approaches the limited-resolution threshold shown in FIG. 9. More specifically, if the reference clock edge-count generated within the fast frequency comparator following a first cycle of the input clock signal at 210 is less than a first limited-resolution threshold (i.e., affirmative determination at decision 212), the fast frequency comparator continues counting reference clock edges over a second cycle of the input clock signal at 216, effectively doubling the edge-count resolution relative to the single-cycle count operation. As shown by decision 218, this approach may be extended for any number of input clock cycles (and resolution thresholds), checking the cumulative edge count following each cycle to determine whether a threshold number of edges have been detected and continuing to count edges over a subsequent input clock cycle if not. Upon determining at 212 or 218 that a sufficient number of edges have been counted to uniquely identify the frequency ratio (i.e., within the frequency step size for a given application), the edge-count is latched at 214 or 220, respectively, as the least significant bits of a frequency-ratio value while the most significant bit or bits of the frequency-ratio value are set to indicate the number of input clock cycles over which the edge-count was accumulated. Other arrangements of bit fields within the frequency-ratio value may be used, so long as the resultant frequency-ratio values are distinguishable from one another for each frequency step over the input clock frequency range. Whatever the format, distinct frequency-ratio values are generated by the fast frequency comparator over varying number of input clock intervals, thus enabling decision logic or other control logic within a clock multiplier unit to perform a tuning or selection operation within a wide-range oscillator as discussed above for each different input clock frequency of interest. As shown at 224, the fast frequency comparator may optionally assert a ratio-update signal or otherwise notify the decision logic (or other control logic) that the frequency-ratio value has been updated.

Figure 11:
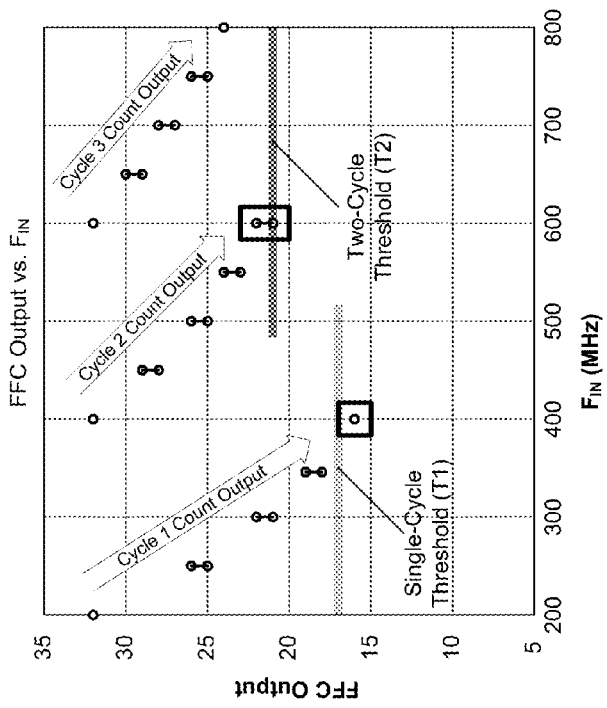
FIG. 11 illustrates an exemplary plot of the frequency-ratio values generated within a fast-frequency comparator that operates in accordance with the resolution threshold logic shown in FIG. 10.

FIG. 11 illustrates an exemplary plot of the frequency-ratio values generated within a fast-frequency comparator that operates in accordance with the resolution threshold logic shown in FIG. 10. As in FIG. 9, the reference clock signal is assumed to oscillate at approximately 3.2 GHz and that the frequency-ratio value is inverted to show a positive correlation with the period of the input clock signal. In alternative embodiments, other reference clock frequencies may be applied, and the frequency-ratio value need not be inverted.

Continuing with FIG. 11, the edge-count values obtained for different input clock frequencies up to 350 MHz are determined to be above a single-cycle edge-count threshold (T1) and thus may be latched within a field of a frequency-ratio value (e.g., forming the LSBs thereof). Upon detecting an edge-count at or below the single-cycle threshold, the cycle-count field of the frequency-ratio value is incremented (or decremented) and edge counting is continued for another cycle of the input clock signal. Through this operation, distinguishable edge-counts are obtained for input clock frequencies ranging in 50 MHz steps from 400 MHz to 550 MHz before resolution headroom is impacted again, and thus a two-cycle threshold (T2) reached, at 600 MHz. Upon detecting an edge-count at or below the two-cycle threshold, the cycle-count field of the frequency-ratio value is incremented again and reference clock edge counting is continued for a third cycle of the input clock, thus enabling distinguishable edge-counts to be obtained for input clock frequencies from 600 MHz to 800 MHz as shown.

Figure 12:
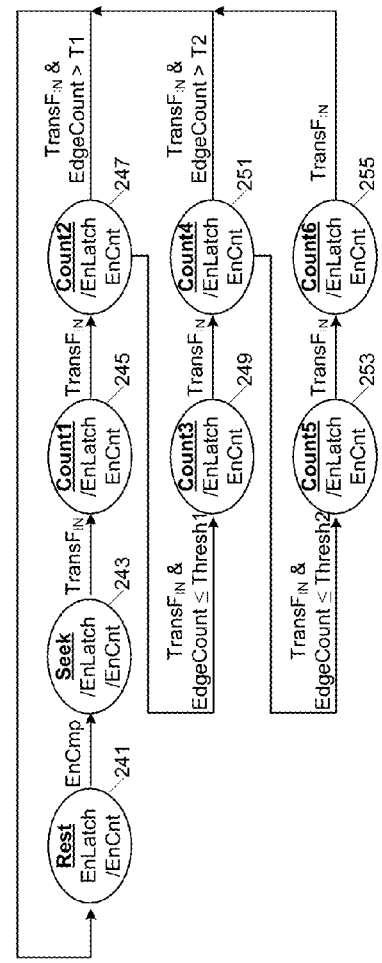
FIG. 12 illustrates an exemplary state diagram that may be implemented within the fast frequency comparator of FIG. 4 to implement the variable-cycle frequency comparison operation described in reference to FIGS. 10 and 11.

FIG. 12 illustrates an exemplary state diagram that may be implemented within the fast frequency comparator of FIG. 4 to implement the variable-cycle frequency comparison operation described in reference to FIGS. 10 and 11. The first four states shown (rest 241, seek 243, count1 245 and count2 247) correspond to like-named states within the state diagram of FIG. 6. Instead of transitioning unconditionally from count2 state 247 back to rest state 241 (and latching the edge count) in response to assertion of the input-transition signal, however, the FFC controller branches (i.e., conditionally transitions) to either rest state 241 or to a count3 state 249 according to whether the edge count (e.g., raw value within counter 143) exceeds the single-cycle threshold. More specifically, if the edge count does not exceed the single-cycle threshold, the FFC controller transitions to the count3 state 249 and then (following another assertion of the input-transition signal) to count4 state 251, thus counting edges of the reference clock signal over another clock cycle. From count4 state 251, the FFC controller conditionally branches to either the rest state or to a count 5 state 253 according to whether the edge count exceeds a two-cycle threshold (Thresh2). That is, if the edge count is determined not to exceed the two-cycle threshold upon exiting count4 state 251, the FFC controller transitions to count5 state 253 and then (following another assertion of the input-transition signal) to count6 state 255 to count reference-clock edges over a third clock cycle. In the embodiment shown, the FFC controller transitions unconditionally from count6 state 255 to rest state 241 at the next assertion of the input-transition signal. In alternative embodiments, additional count states may be entered to count edges over additional cycles of the input clock. The FFC controller may also issue signals to increment a cycle count value which forms a field (e.g., most significant bit or bits, or least significant bits) within the final frequency-ratio value output by the fast-frequency comparator, thus enabling distinction between otherwise similar edge-count values obtained over different frequency compare intervals.

Figure 13:
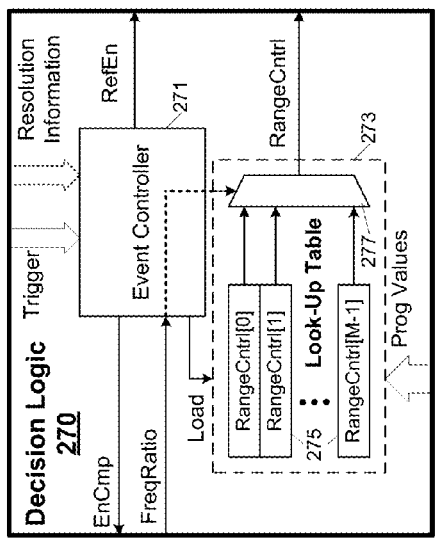
FIG. 13 illustrates an embodiment of a decision logic circuit that may be used to implement the decision logic shown in FIG. 1.

FIG. 13 illustrates an embodiment of a decision logic circuit 270 that may be used to implement decision logic 103 of FIG. 1. As shown, decision logic 270 includes a look-up table 273 (LUT) to store a set of range-control values (RangeCntrl [M−1:0]) and an event controller 271 to control table programming and look-up operations and control operation of the fast-frequency comparator and reference clock generators.

In one embodiment, event controller 271 is implemented by a state machine that transitions from a quiescent state to a frequency-update state in response to triggering information ("Trigger") that indicates a frequency change in the input clock signal. In an alternative embodiment, event controller 271 or other circuitry within decision logic 270 may monitor the input clock signal and thus enable self-detection of changes in the input clock frequency, and responsive transitioning to the frequency-update state. In either case, upon entering the frequency-update state, event controller 271 asserts one or more reference-enable signals (RefEn) to enable operation or selection of one or more reference clock generators.

After delaying for a time sufficient for the reference clock generator(s) to stabilize, event controller 271 asserts a compare-enable signal (EnCmp) to enable a frequency comparison operation within the fast-frequency comparator, eventually receiving an updated frequency-ratio value therefrom. In one embodiment, the frequency-ratio value (FreqRatio) is applied directly to look-up table 273 to select one of the range-control values stored therein for output via multiplexing logic 277 as the finalized range-control value (RangeCntrl). In alternative embodiment, event controller 271 latches or registers the frequency-ratio value (e.g., in response to a signal indicating that the range-control value has been updated or after a predetermined frequency compare interval has transpired), and outputs the internally registered frequency-ratio value (or value derived therefrom) to look-up table 273 to effect selection of the finalized range-control value.

In the embodiment of FIG. 13, look-up table 273 includes a set of programmable registers 275 each of which may be loaded with a respective range-control value during a run-time or production-time programming operation. By this arrangement, different combinations of range-control values may be programmed within the look-up table and associated with different frequency-ratio values in accordance with application requirements and/or system characteristics. In the implementation shown, event controller 271 manages the lookup-table load operations by asserting a load signal (Load) in response to register-programming commands issued by a processor, ASIC or other controller IC, thereby enabling look-up table values corresponding to respective register-programming commands (and output in association therewith by the processor, ASIC or other controller IC) to be loaded into a selected one of programmable registers 275. In alternative embodiments, the range-control values corresponding to different frequency-ratio values may be hardcoded into an algorithmic or heuristic logic circuit (e.g., synthesized logic) instead of being stored within programmable look-up table 273. In some embodiments, register values can be used to define simple threshold levels for comparators to determine valid output range settings.

As discussed above, varying frequency-ratio resolution may be needed depending upon the maximum frequency of the input clock signal and the frequency steps to be distinguished. While the frequency-compare interval may be extended to achieve higher resolution, from a system point of view, it is desirable to keep the frequency-compare interval brief as it contributes directly to the overall lock time of the clock multiplier unit. In one embodiment, decision logic 270 receives information indicating the required frequency-ratio resolution and, based on that information, enables operation of a corresponding number of reference clock sources at different frequencies and edge-counting with respect to each. In a maximum resolution circumstance, for example, the decision logic may enable generation of as many as M reference clock signals (e.g., each at a different frequency and/or phase), and a corresponding set of M component edge-counting circuits may be selectively enabled within a fast-frequency comparator to count edges of the M reference clock signals, respectively.

Figure 14:
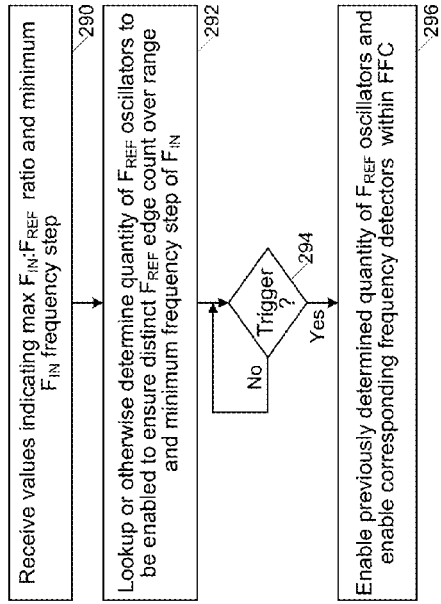
FIG. 14 illustrates an exemplary sequence of operations that may be carried out within the event controller of FIG. 13 to establish a desired frequency-ratio resolution.

FIG. 14 illustrates an exemplary sequence of operations that may be carried out within the event controller of FIG. 13 to establish a desired frequency-ratio resolution. Starting at 290, the event controller receives frequency-ratio resolution information which, in this example, includes a value indicating the maximum $F_{IN}:F_{REF}$ ratio (i.e., a minimum $F_{REF}:F_{IN}$ ratio) and the granularity of frequency steps to be resolved. At 292, the event controller looks up (or algorithmically or heuristically determines) the quantity of reference clock oscillators to be enabled to ensure a distinct $F_{REF}$ edge count between the maximum frequency input clock (i.e. corresponding to the maximum $F_{IN}:F_{REF}$ ratio) and an input clock signal at the maximum frequency less the minimum frequency step. Thereafter, the event controller awaits indication of a frequency change in the input clock (i.e., trigger detection), conceptually shown by the looping at decision block 294. Upon detecting or receiving the frequency-change indication, the event controller enables the previously determined quantity of reference clock oscillators to begin oscillating and then enables corresponding edge-counting circuits within a fast-frequency comparator to generate respective edge-count values. As explained below, the edge-count values may be summed, averaged or otherwise combined, to generate a finalized frequency-ratio value, thereby yielding a frequency-ratio value based on a substantially higher edge-count and thus having a substantially higher resolution than the single reference clock embodiments described above.

Figure 15:
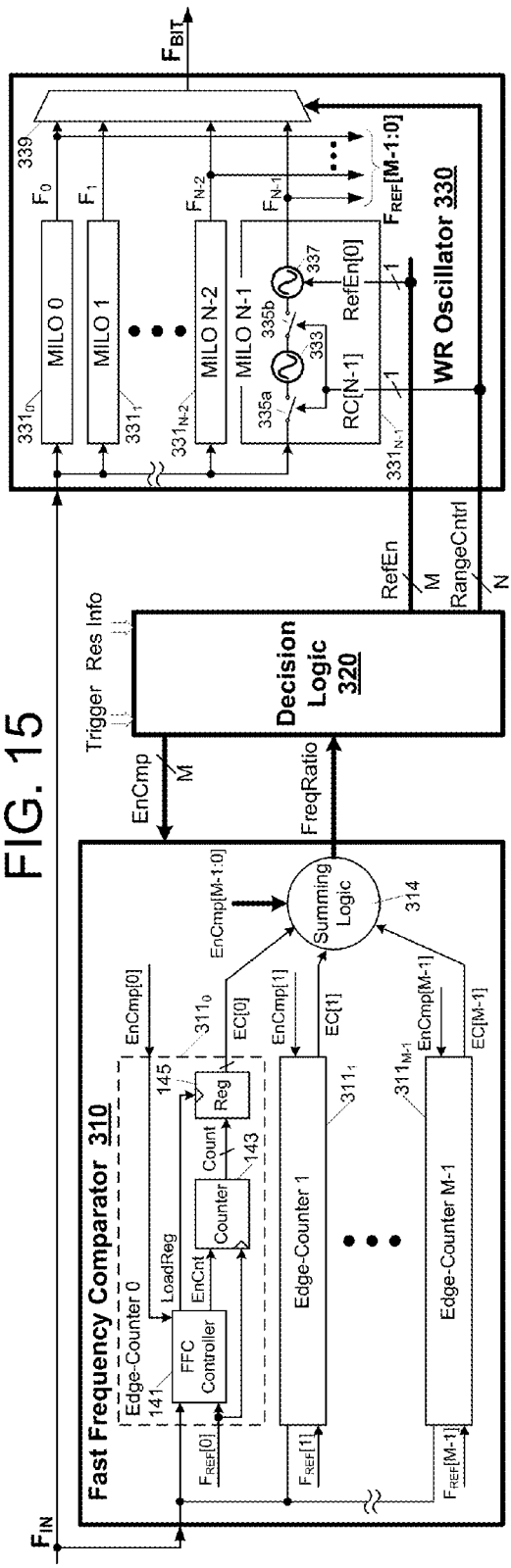
FIG. 15 illustrates an embodiment of a clock multiplying unit capable of generating a variable-resolution frequency-ratio value in accordance with the approach shown in FIG. 14

FIG. 15 illustrates an embodiment of a clock multiplying unit capable of generating a variable-resolution frequency-ratio value in accordance with the approach shown in FIG. 14. In the implementation shown, decision logic 320 receives resolution information ("Res Info") and applies that information to determine a quantity of $F_{REF}$ oscillators needed to generate a frequency-ratio value with sufficient resolution. (e.g., sufficient to fully distinguish each input frequency step across a specified or predetermined range). Upon detecting or receiving a trigger indicating a change in the input clock frequency, decision logic 320 asserts a quantity of reference-enable signals (RefEn) in accordance with the quantity of $F_{REF}$ oscillators determined in response to the resolution information. In a minimum-resolution application, for example, only one of M reference-enable signals is asserted, thereby enabling only a single reference clock generator. In a maximum resolution application, by contrast, all M reference-enable signals may be asserted to enable M reference clock generators at different frequencies.

In the embodiment of FIG. 15, a wide-range oscillator 330 includes N MILOs ($331_0$-$331_{N-1}$) to generate respective frequency-multiplied clock signals, $F_0$-$F_{N-1}$, any one of which may be selected via multiplexing logic 339 to source a final output clock of the CMU (i.e., $F_{BIT}$). In general, each of the MILOs may be placed in either a disabled state or an injection-locking state, thus enabling decision logic 320 to select one of the MILOs to generate the CMU output clock while disabling the remaining MILOs to save power. In the embodiment shown, at least M of the MILOs are also capable of operating in a free-running oscillation state (i.e., oscillating at the natural frequency of one or more constituent ring oscillators), thus enabling a variable number of the MILOs to be operated as reference clock generators. In one implementation, shown for example in the detail view of MILO N−1 ($331_{N-1}$), two ring oscillators 333 and 337 may be switchably coupled in series between the input clock and MILO output node to form a multi-stage injection-locked ring oscillator (an edge-multiplying circuit may also be provided to effect frequency multiplication as discussed below). More specifically, when switch elements 335a and 335b are closed in response to a constituent bit of the range-control signal (RC[N−1]), injection pulses generated in response to transitions of the input clock signal $F_{IN}$ are supplied to an injection port of first-stage ring oscillator 333 to effect injection-locked generation of a multi-phase, frequency-multiplied clock signal. The multi-phase clock signal is supplied via switch element 335b (which may include multiple switch elements, one for each phase of the multi-phase clock) to second-stage ring oscillator 337 which, when enabled by reference-enable signal, RefEn[0], generates a corresponding injection-locked clock which is output as clock $F_{N-1}$ (and thus $F_{BIT}$). When the range-control bit and the reference-enable signal are both deasserted, both ring-oscillators are disabled (e.g., by breaking the ring connection within each of oscillators 333 and 337, removing power from the inverters that form the ring oscillators and/or otherwise preventing oscillation), thus establishing a disabled state of the MILO. By contrast, when the range-control bit is deasserted and the reference-enable signal is asserted, the MILO is placed in the free-running oscillation mode, referred to herein as a reference state. In the embodiment shown, switch elements 335a and 335b can be opened in response to the deasserted range-control bit (and first-stage ring oscillator disabled), while the second stage oscillator can enabled by assertion of reference-enable signal RefEn[0], thus causing the second stage ring oscillator to oscillate at the natural frequency of the ring circuitry. Accordingly, any number between 1 and M MILOs may be configured to operate in their respective reference states (i.e., by deasserting respective range-control bits and asserting respective reference-enable signals) to supply edge-counting resolution within the fast-frequency comparator. Note that while the number of MILOs operable in the reference state (i.e., M MILOs) may be fewer than the total number of MILOs within the wide-range oscillator (i.e., M<N), all the MILOs may be operable in the reference state (M=N). In the case of MILOs limited to disabled or enabled operation (i.e., no reference-state operation), the range-control signal may be used to enable and disable the second stage ring-oscillator in place of the reference-enable signal supplied to the reference-state MILOs.

Still referring to FIG. 15, the fast-frequency comparator 310 includes multiple edge counters ($311_0$-$311_{M-1}$) having respective frequency-detect outputs coupled to summing logic circuit 314. Each of the edge-counters 311 is coupled to receive the input clock as well as a respective one of reference clocks $F_{REF}$[M−1:0] from wide-range oscillator 330, and a respective one of compare-enable signals EnCmp[M−1:0] from decision logic 320. In one embodiment, each of the edge-counters 311 includes an FFC controller 141, counter 143 and output register 145 that may operate generally as described with respect to like-named components of the fast-frequency comparator embodiments described in reference to FIGS. 4-8 to generate edge-count values over one or more cycles of the input clock signal. By this arrangement, decision logic 320 may enable from 1 to M reference clock generators within wide-range oscillator 330 (e.g., enabling 1 to M MILOs to operate in the reference state) and thereafter assert a corresponding number of compare-enable signals EnCmp [M−1:0] to respective edge counters 311 within fast frequency comparator 310, thus enabling generation of respective edge count values, EC[M−1:0]. Note that, generally speaking, the design of each edge-counter $311_0$-$311_M$ can be identical, although FIG. 15 shows detail design of only the first edge-counter, $311_0$, to simplify the Figure. As shown, the compare-enable signals are also supplied to summing logic 314 to indicate which of the edge-count values are valid for a given frequency compare interval and thus enable only valid edge-count values to be included in a combined value which constitutes the final frequency-ratio value, FreqRatio. Values of the reference frequencies for the various MILOs which are enabled can be selected a number of different ways depending on the output resolution and lock-time requirements. In some embodiments they are broadly spaced and experience only slight overlap in valid operating frequencies. In other embodiments which are more focused on achieving fast locking at high resolution, the different enabled MILOs can be tuned to be close in reference frequencies.

Figure 16C:
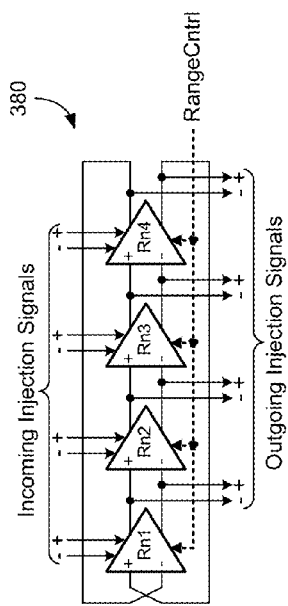
FIG. 16C illustrates an embodiment of a ring oscillator that may be used to implement either or both of the ring oscillator stages depicted in FIG. 16A.
Figure 16D:
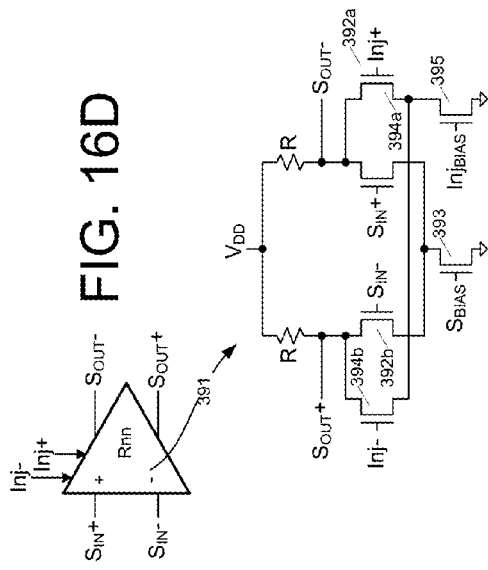
FIG. 16D illustrates an embodiment of a delay element that may be used to implement any of the delay elements within the ring oscillators of FIGS. 16A and 16C, and/or within the pulse injector of FIG. 16A.
Figure 16A:
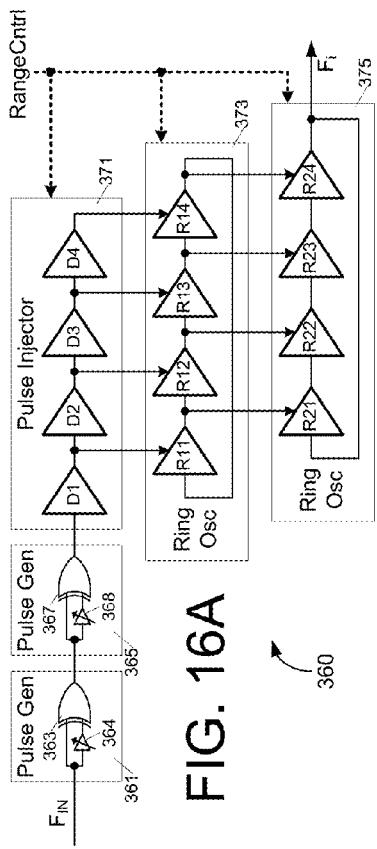
FIG. 16A illustrates an embodiment of a MILO that may be used to implement any or all of the MILOs shown or described in reference to preceding Figures.
Figure 16B:
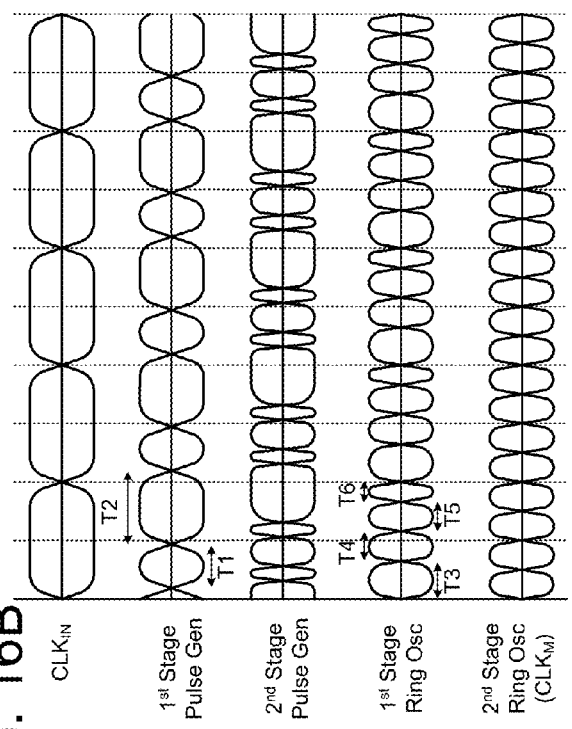
FIG. 16B is a timing diagram illustrating an exemplary operation of the MILO shown in FIG. 16A.

FIGS. 16A and 16B illustrate an embodiment and exemplary operation of a multiplying, injection-locked oscillator (MILO) 360 that may be used to implement any or all of the MILOs described above. As shown, MILO 360 includes a pair of pulse generator stages 361 and 365, pulse injector 371, and a pair of ring oscillator stages 373 and 375. The incoming clock signal, $F_{IN}$, is supplied to first-stage pulse generator 361 which includes pulse-generating logic (e.g., XOR gate 363 and delay element 364) to generate a pulse, and thus a rising and falling output signal transition, in response to each transition of the input clock. FIG. 16B shows the result of this operation in a differential implementation, demonstrating the doubling of the number of timing edges generated by the first-stage pulse generator relative the incoming clock signal. As shown, the width of each pulse generated by the pulse generator (T1) may not exactly equal half the time between successive input clock edges, and therefore may not equal the time between pulses (T2). This "duty cycle imbalance" in the output pulse waveform (i.e., non-uniform pulse widths) may be corrected to some degree by adjusting the delay applied within delay element 364. Other duty cycle correction techniques and circuitry may also be employed to further equalize (or at least reduce the difference between) times T1 and T2. Also, while ring oscillators are depicted in the embodiment of FIG. 16A and other embodiments described herein, in all such cases alternative oscillator circuits such as LC (inductor-capacitor) oscillators may be employed instead of or in combination with ring oscillators.

Still referring to FIGS. 16A and 16B, the pulse stream output from first-stage pulse-generator 361 is supplied to second-stage pulse-generator 365 which also includes pulse-generating logic (XOR gate 367 and delay element 368) to double the number of timing edges. As discussed above, this edge-doubling operation yields a pulse (two edges) in the output pulse stream delivered to pulse injector 371 in response to each edge in the input pulse stream (from first-stage pulse generator 361) as shown in FIG. 16B, and thus four edges for each edge in the input clock signal. As with the first-stage pulse generator, the duty-cycle imbalance imparted by the second-stage pulse generator may be mitigated by adjusting the propagation delay through delay element 368, and/or additional duty cycle correction circuitry.

In one embodiment, pulse injector 371 includes a delay line formed by a sequence of delay elements, D1-D4, tuned to have delays corresponding to delays of counterpart delay elements, R11-R14 and R21-R24, within the first and second ring oscillator stages, 373 and 375, respectively. Thus, the propagation delay through any of the pulse-injector delay elements (D1-D4), a time interval referred to herein as a "unit-delay," approximately matches the propagation delay through any of the ring-oscillator delay elements (R11-R14 and R21-R24) within the first and second ring oscillator stages. Consequently, by selecting the output of each delay element within pulse injector 371 as the injection pulse source for a corresponding delay element within first ring oscillator stage 373, the injection pulses will be applied within the ring oscillator in cascading fashion, with each delay element of ring oscillator 373 receiving an injected pulse a unit-delay later than the preceding delay element in the ring and thus at approximately the same phase offset with respect to the desired frequency of the clock signal output by ring oscillator 373. In the particular embodiment shown, the natural frequency of ring oscillators 373 and 375 is tuned or designed to be approximately four times a target input clock frequency (i.e., one of multiple, stepped input clock frequencies ranging from a minimum to a maximum input clock frequency to be accommodated by the host clock multiplier unit), so that the injection pulse stream generated in response to the target input clock frequency has a pulse frequency within the injection-locking range of the first and second stage ring oscillators 373, 375. That is, the injected pulses effect small but regular phase corrections (correcting for a difference between the ring oscillator's natural frequency and a multiplied-by-4 input clock frequency) so that the output frequency of the first-stage ring oscillator locks 373 to the injection pulse frequency (i.e., is "injection-locked") and thus to a 4× multiple of the target input clock frequency.

As shown in FIG. 16B, the corrections effected by the injection-locking pulses produce a repeatable variation in the pulse widths of the clock output by the first-stage ring oscillator 373. That is, a pulse having a relatively wide duration (T3) is followed by a pair of pulses having intermediate durations (T4 and T5) and then by a pulse having a relatively short duration (T6). In the embodiment of FIG. 16A, this jitter (i.e., edge-to-edge timing variation or jitter) in the clock output by the first-stage ring oscillator 373 is mitigated (filtered, in effect) by applying the outputs of the first-stage ring oscillator delay elements as injection pulses into the second-stage ring oscillator 375, thus yielding the reduced-jitter MILO output clock ($CLK_M$) shown in FIG. 16B. Also, given the deterministic nature of the jitter (e.g., short pulse occurring after every Nth edge, and wide pulse occurring after every short pulse), edge multiplexing techniques may be used to replace early or late edges with less early/less late edges, thereby further mitigating the jitter. Also, one or more additional ring oscillator stages and/or duty cycle correction circuitry may be provided to further reduce deterministic jitter.

FIG. 16C illustrates an embodiment of a ring oscillator 380 that may be used to implement either or both of the ring oscillator stages (373, 375) depicted in FIG. 16A. As in FIG. 16A, ring oscillator 380 includes four delay elements, Rn1-Rn4, though more or fewer delay stages may be provided in alternative embodiments. Each of the delay elements receives a differential input and, after a finite (and tune-able) propagation delay, outputs an inverted instance of the differential input. To establish an odd number of inversions from the output of a given delay element to its input (and thus effect oscillation of the ring), the differential output of the final delay element (Rn4) is twisted with respect to its input to the first delay element (Rn1), a twist that may be omitted, for example, in an implementation having an odd number of inverting delay elements. As shown, the differential outputs of individual delay elements may be supplied as injection signals to a subsequent ring-oscillator stage, and incoming injection signals are supplied to respective delay elements. An analog or digital delay control signal is supplied to each of the delay elements within ring oscillator 380 (and, as shown in FIG. 16A, to each of the delay elements within pulse-injector 371) to enable tuning/calibration of a single unit-delay, and thus the natural frequency of the ring-oscillator.

FIG. 16D illustrates an embodiment of a delay element, "Rnn," that may be used to implement any of the delay elements within the ring oscillators of FIGS. 16A and 16C, and/or within the pulse injector of FIG. 16A. As shown at detail view 391, differential input signals $S_{IN}+/S_{IN}-$ are supplied to control nodes (e.g., gate terminals in a field-effect transistor (FET) implementation) of input transistors 392a and 392b, each of which is coupled in series between a resistive pull-up element (R, pulled up to $V_{DD}$ in the example shown) and a common current source 393. By this arrangement, when $S_{IN}+$ is high and $S_{IN}-$ is low, input transistor 392a is switched on (i.e., to a conducting state) and input transistor 392b is switched off (i.e., to a non-conducting or negligibly-conducting state) so that the current drawn by current source 393 (implemented, for example, by a bias-signal-controlled transistor 395 as shown), flows predominantly through transistor 392a. This draws the voltage at output node $S_{OUT}-$ low while the voltage at node $S_{OUT}+$ is pulled high, thus yielding an inverted differential output. When the input state reverses, $S_{IN}+$ transitioning from high to low and $S_{IN}-$ transitioning from low to high, the differential output is similarly switched, with $S_{OUT}+$ going high and $S_{OUT}-$ going low. The net propagation delay through the delay element may be controlled by adjusting the resistance of resistive load elements (and/or the capacitance of capacitive load elements coupled to the output nodes, not shown). Also, in the embodiment shown, an injection port is provided by injection transistors 394a and 394b, each of which is coupled in series between a respective one of the resistive load elements (R) and an injection current source 395 (formed, in this example, by an injection-bias-controlled transistor). In this configuration, injection signals Inj+ and Inj− are effectively wire-ORed with the delay-element inputs, $S_{IN}+$ and $S_{IN}-$. This operation permits the advancement or delay of the time at which the differential amplifier is switched between positive and negative output states, thereby increasing or reducing the net propagation delay through the delay element stage and thus the ring oscillator as a whole. When deployed as a delay element within pulse injector 371 of FIG. 16A, the inputs to the injection port may be tied low, thereby replicating the overall structure for delay matching between the delay element and pulse-injector elements, but preventing unwanted signal injection.

Various changes may be made to the delay element of FIG. 16D in alternative embodiments including, without limitation, changes in the manner of adjusting the delay element, the implementation of the injection port, the bias current controls and so forth. Also, while a current-mode logic (CML) implementation is shown, the delay elements within the pulse injector and/or ring oscillators may alternatively be implemented by respective pairs of CMOS (complementary metal-oxide-semiconductor) inverters having propagation delays controlled, for example, by adjusting the inverter supply voltage. Alternate embodiments for the design of delay elements and injection blocks may include, for example and without limitation, CMOS inverters, differential sense-amp structures, regulated elements, CVSL (cascade voltage switch logic) or DCVSL (differential CVSL) elements and others. In other embodiments injection can be accomplished by other means, i.e. application of a null to the stage output data, or other forcing of a known state into the loop.

Reflecting on FIGS. 16A-16D, it should be noted that various frequency-multiplication ratios other than that shown may be achieved, including a unity multiplication ratio (i.e., an output clock frequency that matches or nominally matches input clock frequency). In one embodiment, for example, the number of pulse-generator circuits (361, 365) coupled between the input clock source and pulse injector 371 may be varied (e.g., bypassing one or more of the pulse generators) according to a register setting or other control to establish the desired number of edge doubling operations, if any. In such an embodiment, the delay elements (e.g., 364, 368) within the pulse generators may be adjusted in calibration operations or according to predetermined settings to mitigate duty cycle distortion in the pulse generator output.

Figure 17:
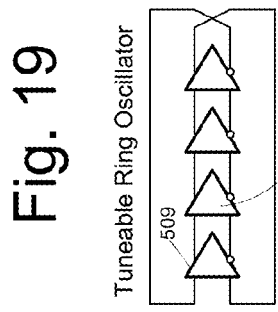
FIG. 17 illustrates an embodiment of a tuneable ring oscillator having a selectable number of delay elements and thus a selectable natural frequency.

As discussed in reference to FIG. 1, a wide-range oscillator may be constructed from multiple component oscillators having staggered lock frequency ranges, or from a solitary oscillator (or a small number of oscillators) that may be tuned to a relatively narrow frequency-locking band within the broader input clock frequency range. FIG. 17, for example, illustrates an embodiment of a tuneable ring oscillator 411 having a selectable number of delay elements 412 and thus a selectable natural frequency. When applied within a MILO or other frequency-multiplying oscillator, the ring length of ring oscillator 411 (i.e., number of delay elements 412 coupled in a ring) may be adjusted to effect a corresponding coarse adjustment of the locking-frequency range of the frequency-multiplying oscillator. As explained below, ring oscillator 411 may also include additional tuning elements to enable the lock frequency range corresponding to each different oscillator ring-length to be finely adjusted to meet finer input clock frequency steps required in a given application.

Referring to the daisy-chained delay stages 412 shown in FIG. 17, a multiplexer 415 selects the outputs of one of Q delay stages 412 within the delay chain to drive the input to the initial delay stage, thus enabling the number of applied delay elements in the ring oscillator to be varied from 1 to Q in response to a frequency control signal 416 (FreqStep). By this arrangement, the natural frequency of the ring oscillator may be adjusted during initial configuration or dynamically during device operation to shift the lock frequency range of a host MILO or other clock-multiplying oscillator. The frequency control signal 416 may be established through register programming, fusible logic, device strapping or any other volatile or non-volatile selection mechanism. When applied within the tuneable MILO of FIG. 3, for example, the frequency-step portion of a range-control value may be applied as the frequency control signal, thus effecting a coarse step in the frequency-locking range of the tuneable MILO. In such an embodiment, the frequency-lock range may be fine-tuned by adjusting the propagation delay within individual delay stages 412 of ring oscillator 411 according to the vernier portion of the range-control value. Examples of delay tuning circuits that may be employed for this purpose are described below.

Figure 18:
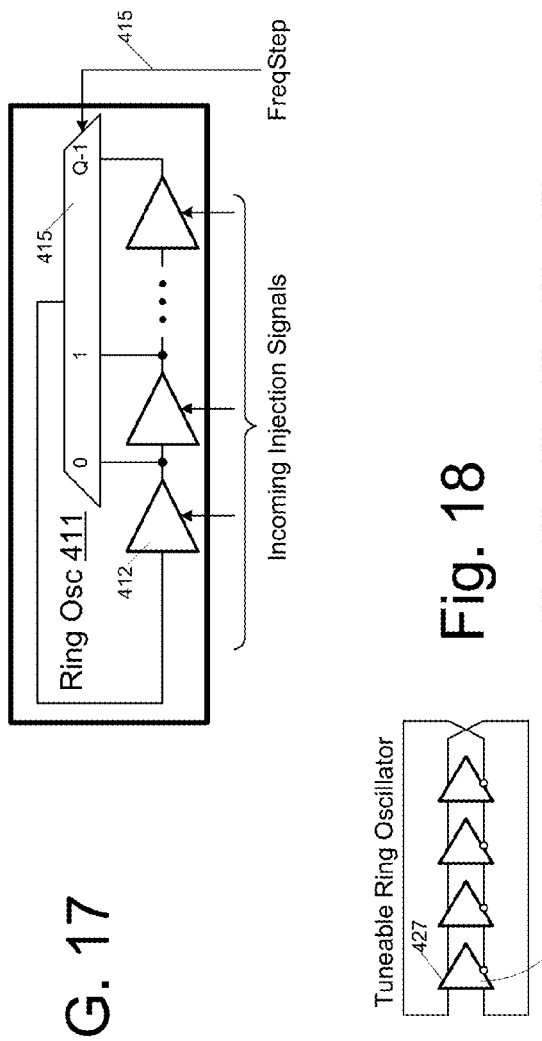
FIG. 18 illustrates an embodiment of a current-mode-logic (CML) delay element that may be used to implement delay elements within the tuneable ring oscillator of FIG. 17.

FIG. 18 illustrates an embodiment of a CML delay element 450 (or delay stage) that may be used to implement tuneable delay elements 427 within a tuneable ring oscillator, including the variable ring-length ring oscillator of FIG. 17. In general, delay element 450 is constructed in the same manner as the delay-element described in reference to FIG. 16A (i.e., including input transistors 392a/392b and current source 393), except that injection port 461 has been generalized to emphasize that various different injection techniques and circuits may be employed. Injection circuit examples include the CML injection circuit shown in FIG. 16D (i.e., formed by current source 395 and injection-input transistors 394a/394b), null-injection circuits that switchably couple the output nodes 455a/455b of the delay element to one another, and so forth. Also, exemplary variable-capacitance ($C_L$) and variable-resistance ($R_L$) elements that may be adjusted (or trimmed or varied) to increase or reduce the propagation delay between input and output signal transitions are shown explicitly.

In one embodiment, a multi-bit vernier value is provided as a field within a range-control value as shown in the tuneable wide-range oscillator of FIG. 3 and used to control both the capacitance of the variable-capacitance element ($C_L$) and the resistance of variable-resistance element ($R_L$) within delay element 450. Note that this vernier value effectively instantiates a digitally controlled delay line (DCDL). For example, in a digital implementation of the resistance and capacitance elements, shown at 475 and 495, respectively, constituent bits of a six-bit vernier value (V[5:0]) are applied to switchably couple respective binary-weighted sub-elements between input and output nodes that form the terminals of the variable-load element. In the exemplary variable-resistance element 475, for instance, each of the vernier bits is coupled to the gate terminal of a respective P-type MOS (PMOS) load transistor $477_0$-$477_5$ (collectively, 477) coupled between input and output nodes 476a, 476b of the resistive element. The PMOS load transistors 477 have binary-weighted widths and thus form respective conductances, $G_U$, $2G_U$, $4G_U$, $8G_U$, $16G_U$, $32G_U$, where unit conductance "$G_U$" represents a desired conductance step as the vernier value is incremented or decremented. Transistor 479 is also coupled between input and output nodes 476a/476b and configured in a conducting state (e.g., gate terminal tied low) to establish a minimum conductance $G_F$ (maximum resistance), and thus a starting point for the conductance range to be spanned by the variable-resistance element. By this arrangement, when all vernier bits are high, all load transistors 477 are switched to a non-conducting state (conducting no current or negligible current) to establish a minimum conductance ($G_F$) or maximum resistance ($1/G_F$). When all vernier bits are low, all load transistors 477 are switched to a conducting state to establish a maximum conductance ($G_F+63G_U$) or minimum resistance ($1/(G_F+63G_U)$). Thus, as the vernier value is stepwise incremented from a minimum value (i.e., '000000b' where 'b' denoted binary) to a maximum value ('111111b'), the conductance of element 475 is decremented, in units of $G_U$, from maximum value $G_F+63G_U$ to minimum value $G_F$, and thus the resistance is incremented from minimum value $1/(G_F+63G_U)$ to maximum value $1/G_F$. In alternative embodiments, non-binary weightings may be used for individual resistive sub-elements (e.g., load transistors 477), and thermometer-coded configurations may be used to establish the weightings of individual resistive sub-elements.

The exemplary variable-capacitance element 495 may be constructed similarly to variable-resistance element 475. Instead of component resistive elements, however, binary-weighted capacitive elements $497_0$-$497_5$ (i.e., each having a respective capacitance, $2^iCu$, where 'i' ranges from 0 to 5) are switchably coupled between input and output nodes 496a/496b by respective switch elements 498, and a minimum-capacitance element 499 (establishing minimum capacitance $C_F$) is provided instead of minimum conductance element $G_F$. By this arrangement, as the vernier value is stepwise incremented from a minimum value ('000000b') to a maximum value ('111111b'), the capacitance of element 495 is incremented, in units of $C_U$, from minimum value $C_F$ to maximum value $CF+63C_U$. In alternative embodiments, non-binary weightings may be used for individual capacitive elements, and thermometer-coded configurations may be used to establish the weightings of individual resistive elements.

Figure 19:
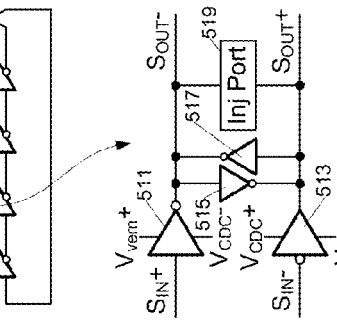
FIG. 19 illustrates an embodiment of a complementary metal oxide semiconductor (CMOS) delay element that may be used to implement delay elements within the tuneable ring oscillator of FIG. 17.

FIG. 19 illustrates an embodiment of a CMOS delay-element 510 that may alternatively be used to implement delay-elements 509 within a tuneable ring oscillator, including the variable ring-length ring oscillator of FIG. 17. Delay element 510 includes a pair of CMOS inverter elements, 511 and 513, coupled to receive a differential input $S_{IN}+/S_{IN}-$ and to generate, in response, a differential output $S_{OUT}+/S_{OUT}-$. The slew rates and thus the propagation delays of inverter elements may be adjusted, for example, by adjusting the inverter supply voltages $V_{CDC}+$ and $V_{CDC}-$. In one embodiment, for example, as the vernier field of a range-control value is increased from a minimum to a maximum value, the inverter supply voltage (i.e., difference between $V_{vern}+$ and $V_{vern}-$) is stepwise decreased from a maximum to a minimum value, thus incrementing the net propagation delay through the delay element. Latching inverters 515, 517 may optionally be coupled between $S_{OUT}+$ and $S_{OUT}-$ as shown to mitigate timing skew between outputs of inverters 511 and 513 (e.g., due to different rising-edge/falling-edge slew rates), and injection port 519 may also be coupled between the outputs of inverters 511 and 513 to enable injection locking.

Reflecting on FIGS. 18 and 19 it should be noted that numerous other techniques and circuit arrangements may be employed to adjust the effective propagation delay through the delay elements shown including, without limitation, adjusting bias currents and/or supply rail voltages to change the slew rate of the delay element output.

Returning briefly to FIG. 2A, each of the MILOs within wide-range oscillator 120 may remain disabled during system start-up (or operated in a free-running "reference" state) until a valid range-control value is generated. Similarly, following a shift in the input clock frequency, all but the previously active MILO may remain disabled until an updated range-control value is received. In either case, upon receiving a newly valid or updated range-control value, the range-control value may be applied to enable one of the component MILOs to begin injection locking, thus sequentially incurring the frequency-compare interval and then an injection-locking delay before the output clock becomes valid (i.e., before the output clock stabilizes at the desired output frequency). While this sequential approach may be acceptable in many applications, the cumulative overhead of the frequency compare interval and the injection-locking delay may exceed timing budgets in some systems, particularly at lower, slower-locking input clock frequencies.

FIG. 20A illustrates an alternative frequency-locking approach in which frequency compare operations and injection locking operations are carried out concurrently (i.e., at least partly overlapping in time), in effect pipelining the two operations so that the time required for one operation (frequency comparison or frequency locking) may be completely or partially hidden under the other. Starting at detection of a frequency-transition trigger at 541, decision logic within the clock multiplier unit concurrently enables injection locking in all or a subset of constituent MILOs within a wide-range oscillator at 543 and asserts one or more reference-enable signals to enable reference clock generation at 544. After the brief interval needed for reference clock stabilization (i.e., generally a shorter interval than the injection locking interval at 543), the decision logic asserts detect enable signals to enable frequency comparison operations within a fast frequency comparator at 545. By this operation, the injection locking time may be at least partly or completely hidden under the frequency compare interval and reference clock start-up interval. Consequently, upon outputting a range-control value at 547 to select a given MILO to source the CMU output clock, the selected MILO may already be injection-locked to the input clock, thus shortening the overall time required to lock the CMU output clock to the new input clock frequency.

FIG. 20B illustrates an embodiment of a clock multiplier unit 570 that applies the pipelined injection-locking and frequency compare approach FIG. 20A, but limits the pipelining to the lower frequency MILOs that exhibit the slowest injection-locking times. Through this approach, power is conserved relative to an embodiment that enables pipelined injection-locking in all (or almost all) MILOs, while at the same time mitigating the worst-case lock-time delay otherwise incurred within the lower frequency MILOs. In the implementation shown, the overall collection of MILOs within a wide-range oscillator are split into two MILO arrays: a low frequency array of MILOs 575 having (or tuned to) relatively low-frequency lock ranges, and a high frequency array of MILOs 577 having higher-frequency lock ranges. During a frequency-comparison phase of the overall frequency lock interval, decision logic 571 enables reference clock generation within a MILO (or multiple MILOs) within the high frequency MILO array 577 and shortly thereafter initiates a frequency comparison operation within fast-frequency comparator 573. At the same time, the decision logic enables injection-locking within each of the MILOs of the low-frequency MILO array 575 (maintaining all MILOs within the high-frequency array in a disabled state or, if used to provide a reference clock, in a reference state). By this arrangement, the relatively long injection-locking delay required within MILOs of the low frequency array 575 is at least partly hidden under the reference clock startup interval and frequency-compare interval. Accordingly, if the frequency comparison indicates a low frequency $F_{IN}$ (i.e., a frequency corresponding to the collective lock range of the MILOs within low frequency array 575), injection-locking within each of the low-frequency MILOs will already be completed or at least partly completed by the time the range-control value is applied to select a specific one of the low-frequency MILOs to drive the CMU output. At that point, the remaining low-frequency MILOs are disabled (as are any of the high-frequency MILOs that had been enabled to generate reference clocks). If the frequency comparison indicates a high frequency $F_{IN}$, the low frequency MILOs and all but the range-control specified one of the high frequency MILOs are disabled.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within an integrated circuit device, the method comprising:
    determining a frequency ratio between an input clock signal and a reference clock signal during a first interval;
    tuning a frequency-locking range of a frequency-multiplying oscillator to a frequency band indicated by the frequency ratio to bound an oscillating frequency of the input clock signal; and
    after tuning the frequency-locking range of the frequency-multiplying oscillator, enabling the frequency-multiplying oscillator to generate an output clock signal that is a frequency-multiple of the input clock signal.

2. The method of claim 1 further comprising generating the reference clock signal within the frequency-multiplying oscillator during the first interval.

3. The method of claim 2 wherein generating the reference clock signal within the frequency-multiplying oscillator during the first interval comprises enabling free-running oscillation of the frequency-multiplying oscillator during the first interval.

4. The method of claim 1 wherein enabling the frequency-multiplying oscillator to generate the output clock signal comprises enabling injection-locked oscillation of the frequency-multiplying oscillator.

5. The method of claim 4 wherein enabling injection-locked oscillation comprises generating injection-locking pulses in response to transitions of the input clock signal and providing the injection-locking pulses to an injection port of the frequency-multiplying oscillator.

6. The method of claim 1 wherein tuning the frequency-locking range of the frequency-multiplying oscillator comprises selecting, in accordance with the frequency ratio, a number of delay stages that are applied within a ring oscillator of the frequency-multiplying oscillator.

7. The method of claim 1 wherein tuning the frequency-locking range of the frequency-multiplying oscillator comprises adjusting propagation delays within a plurality of delay elements that form a ring oscillator within the frequency-multiplying oscillator.

8. The method of claim 1 wherein determining the frequency ratio between the input clock signal and the reference clock signal comprises:
    counting edges of the reference clock signal over a first sub-interval that corresponds to a first cycle of the input clock signal to generate an edge-count value;
    comparing the edge-count value to a threshold; and
    counting edges of the reference clock cycle over a second sub-interval if the edge-count indicates a number of edges of the reference clock signal fewer than the threshold.

9. The method of claim 8 wherein the second sub-interval comprises a second cycle of the input clock signal.

10. The method of claim 8 further comprising incrementing a cycle-count value if the edge-count value indicates a number of edges of the reference clock signal fewer than the threshold, the cycle-count value forming a field within a value indicative of the frequency ratio.

11. An integrated circuit device comprising:
    a frequency comparator to determine a frequency ratio between an input clock signal and a reference clock signal during a first interval;
    a frequency-multiplying oscillator having a variable frequency-locking range; and
    control logic to (i) tune the variable frequency-locking range of the frequency-multiplying oscillator to a frequency band indicated by the frequency ratio to bound an oscillating frequency of the input clock signal, and (ii) enable the frequency-multiplying oscillator to generate an output clock signal that is a frequency-multiple of the input clock signal.

12. The integrated circuit device of claim 11 wherein the control logic comprises circuitry to enable the frequency-multiplying oscillator to generate the reference clock signal.

13. The integrated circuit device of claim 12 wherein the circuitry to enable the frequency-multiplying oscillator to generate the reference clock signal comprises circuitry to establish a free-running oscillation mode within the frequency-multiplying oscillator during the first interval.

14. The integrated circuit device of claim 11 wherein the control logic to enable the frequency-multiplying oscillator to generate the output clock signal comprises circuitry to enable injection-locked oscillation of the frequency-multiplying oscillator.

15. The integrated circuit device of claim 14 wherein the circuitry to enable injection-locked oscillation comprises pulse generator circuitry to generate injection-locking pulses in response to transitions of the input clock signal and to output the injection-locking pulses to an injection port of the frequency-multiplying oscillator.

16. The integrated circuit device of claim 11 wherein the frequency-multiplying oscillator comprises a plurality of delay stages, and wherein the control logic to tune the frequency-locking range of the frequency-multiplying oscillator comprises circuitry to select, in accordance with the frequency ratio, a number of the delay stages that are coupled to form a ring oscillator of the frequency-multiplying oscillator.

17. The integrated circuit device of claim 11 wherein the frequency-multiplying oscillator comprises a plurality of delay stages coupled to form a ring oscillator, and wherein the control logic to tune the frequency-locking range of the frequency-multiplying oscillator comprises circuitry to adjust respective propagation delays within the delay elements.

18. The integrated circuit device of claim 11 wherein the frequency comparator to determine the frequency ratio between the input clock signal and the reference clock signal comprises circuitry to:

count edges of the reference clock signal over a first sub-interval that corresponds to a first cycle of the input clock signal to generate an edge-count value;
compare the edge-count value to a threshold; and
count edges of the reference clock cycle over a second sub-interval if the edge-count indicates a number of edges of the reference clock signal fewer than the threshold.

19. The integrated circuit device of claim 18 wherein the frequency comparator to determine the frequency ratio between the input clock signal and the reference clock signal further comprises circuitry to increment a cycle-count value if the edge-count value indicates a number of edges of the reference clock signal fewer than the threshold, the cycle-count value forming a field within a value indicative of the frequency ratio.

20. A machine readable medium that stores data representative of a circuit component comprising:

a frequency comparator to determine a frequency ratio between an input clock signal and a reference clock signal during a first interval;
a frequency-multiplying oscillator having a variable frequency-locking range; and
control logic to (i) tune the variable frequency-locking range of the frequency-multiplying oscillator to a frequency band indicated by the frequency ratio to bound an oscillating frequency of the input clock signal, and (ii) enable the frequency-multiplying oscillator to generate an output clock signal that is a frequency-multiple of the input clock signal.

* * * * *